US012671383B2

(12) United States Patent
Goto et al.

(10) Patent No.: US 12,671,383 B2
(45) Date of Patent: Jun. 30, 2026

(54) METHOD OF MANUFACTURE OF ACOUSTIC WAVE DEVICE WITH TRENCH PORTIONS FOR TRANSVERSE MODE SUPPRESSION

(71) Applicant: SKYWORKS SOLUTIONS, INC., Irvine, CA (US)

(72) Inventors: Rei Goto, Osaka (JP); Hironori Fukuhara, Ibaraki (JP); Benjamin Paul Abbott, Irvine, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 570 days.

(21) Appl. No.: 18/131,044

(22) Filed: Apr. 5, 2023

(65) Prior Publication Data

US 2023/0327630 A1     Oct. 12, 2023

Related U.S. Application Data

(60) Provisional application No. 63/362,682, filed on Apr. 8, 2022, provisional application No. 63/362,679, filed
(Continued)

(51) Int. Cl.
*H03H 3/08* (2006.01)
*H03H 9/02* (2006.01)
(Continued)

(52) U.S. Cl.
CPC .......... *H03H 3/08* (2013.01); *H03H 9/02574* (2013.01); *H03H 9/02992* (2013.01);
(Continued)

(58) Field of Classification Search
CPC ......... H01L 21/32136; H01L 21/31116; H10P 50/285; H10P 50/282
See application file for complete search history.

(56) References Cited

U.S. PATENT DOCUMENTS 9,065,424 B2     6/2015     Nakanishi et al.
9,136,458 B2     9/2015     Komatsu et al.
(Continued)

FOREIGN PATENT DOCUMENTS

| | | |
|---|---|---|
| CN | 113098432 A | 7/2021 |
| FR | 3105894 A1 | 7/2021 |
| JP | 2020092422 A | 6/2020 |

*Primary Examiner* — Thomas T Pham
(74) *Attorney, Agent, or Firm* — Lando & Anastasi, LLP

(57) ABSTRACT

A method of manufacturing an acoustic wave device is provided. The method of manufacturing the acoustic wave device comprises providing a layer of piezoelectric material, disposing a pair of interdigital transducer electrodes on an upper surface of the layer of piezoelectric material, each interdigital transducer electrode including a bus bar and a plurality of electrode fingers extending from the bus bar towards an edge region of the interdigital transducer electrode at the distal ends of the electrode fingers, and etching trench portions into the upper surface of the layer of piezoelectric material, the trench portions overlapping with the edge regions of the interdigital transducer electrodes. The formation of the trench portions through etching results in an easier fabrication, that is less likely to damage the interdigital transducer electrodes.

20 Claims, 23 Drawing Sheets

Related U.S. Application Data on Apr. 8, 2022, provisional application No. 63/362, 680, filed on Apr. 8, 2022.

(51) Int. Cl.

| | |
|---|---|
| *H03H 9/13* | (2006.01) |
| *H03H 9/58* | (2006.01) |
| *H03H 9/64* | (2006.01) |
| *H03H 9/145* | (2006.01) |
| *H03H 9/25* | (2006.01) |

(52) U.S. Cl.
CPC ............ *H03H 9/131* (2013.01); *H03H 9/587* (2013.01); *H03H 9/6483* (2013.01); *H03H 9/145* (2013.01); *H03H 9/25* (2013.01)

(56) References Cited

U.S. PATENT DOCUMENTS

| | | | |
|---|---|---|---|
| 9,257,960 | B2 | 2/2016 | Ruile et al. |
| 9,374,062 | B2 | 6/2016 | Iwamoto |
| 9,413,330 | B2 | 8/2016 | Shimizu et al. |
| 9,640,750 | B2 | 5/2017 | Nakanishi et al. |
| 9,673,779 | B2 | 6/2017 | Ruile et al. |
| 9,748,924 | B2 | 8/2017 | Komatsu et al. |
| 10,361,678 | B2 | 7/2019 | Iwaki et al. |
| 10,574,207 | B2 | 2/2020 | Yoon et al. |
| 11,239,817 | B2 | 2/2022 | Hatano et al. |
| 2004/0021529 | A1* | 2/2004 | Bradley ............. H03H 9/02141 310/349 |
| 2013/0051588 | A1* | 2/2013 | Ruile ................... H03H 9/1457 29/25.35 |
| 2014/0285287 | A1 | 9/2014 | Komatsu et al. |
| 2017/0214385 | A1 | 7/2017 | Bhattacharjee |
| 2020/0021266 | A1 | 1/2020 | Swamy |
| 2020/0067482 | A1 | 2/2020 | Maki et al. |
| 2020/0144984 | A1 | 5/2020 | Fukuhara et al. |
| 2020/0177159 | A1 | 6/2020 | Liu et al. |
| 2020/0212875 | A1 | 7/2020 | Goto et al. |
| 2020/0212876 | A1 | 7/2020 | Goto et al. |
| 2020/0212883 | A1 | 7/2020 | Goto et al. |
| 2020/0287519 | A1* | 9/2020 | Kishino .............. H03H 9/0028 |
| 2021/0006225 | A1 | 1/2021 | Hatano |
| 2021/0167748 | A1 | 6/2021 | Huck et al. |
| 2021/0399714 | A1* | 12/2021 | Koskela ................. H03H 9/568 |
| 2022/0103154 | A1* | 3/2022 | Cardona ........... H03H 9/02031 |
| 2022/0247377 | A1 | 8/2022 | Hayashi |
| 2022/0360249 | A1 | 11/2022 | Ballandras et al. |
| 2023/0016884 | A1 | 1/2023 | Goto et al. |
| 2023/0327642 | A1 | 10/2023 | Goto et al. |
| 2023/0327645 | A1 | 10/2023 | Goto et al. |
| 2023/0402989 | A1 | 12/2023 | Merker et al. |
| 2023/0402991 | A1 | 12/2023 | Nishimura |
| 2024/0039508 | A1 | 2/2024 | Zheng et al. |
| 2024/0183024 | A1* | 6/2024 | Kuroda ................... C23C 14/34 |

* cited by examiner

B    G  E        C        E  G    B

A ---

B ---

500

508

512    510    506    512

X        Y

ACTIVE REGION

FIG.5 PIEZOELECTRIC TRENCH STRUCTURE

COMPARISON WITHOUT TRENCHES

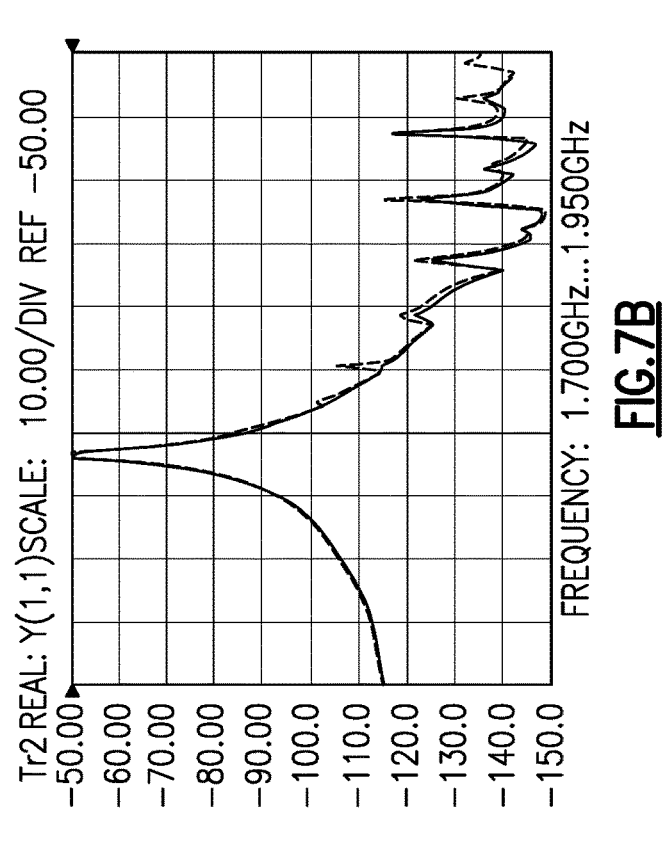
FIG.7A
FIG.7B
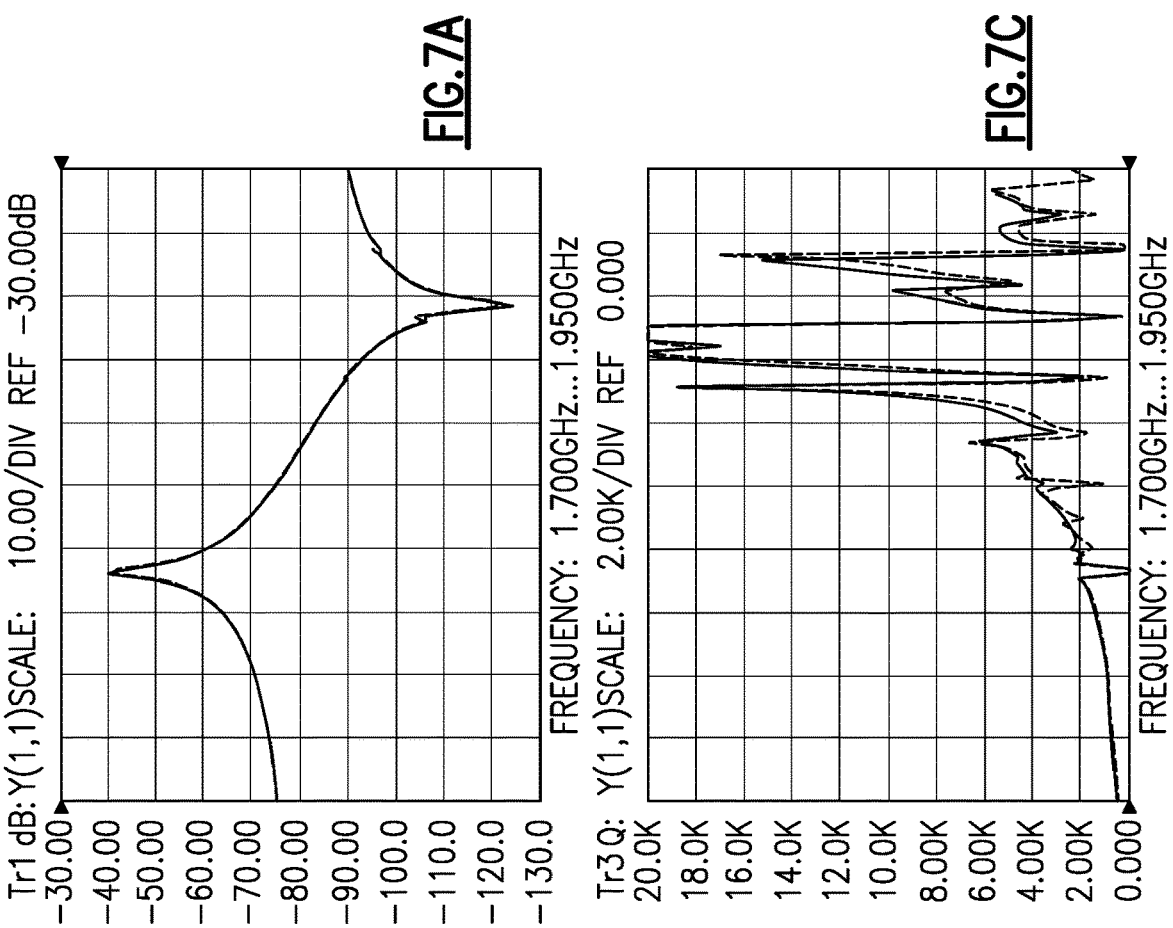
FIG.7C
——— FIG.5 PIEZOELECTRIC TRENCH STRUCTURE
----- FIG.4 PRIOR ART COMPARISON ········· w=1.0L, h=0.004L ———— w=1.0L, h=0.007L

- - - - w=1.0L, h=0.010L

······· w=0.5L, h=0.010L

——— w=0.5L, h=0.015L

– – – w=0.5L, h=0.020L

—— FIG.5 DEVICE (WITH MINI BUS BAR)

—— FIG.10 DEVICE (WITHOUT MINI BUS BAR)

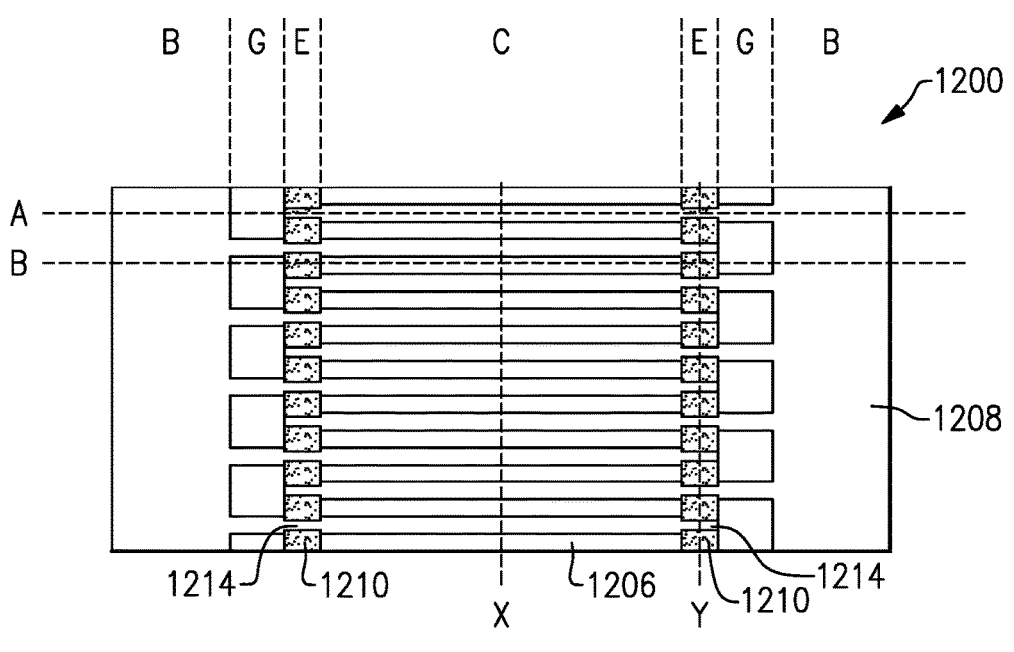
FIG.12A
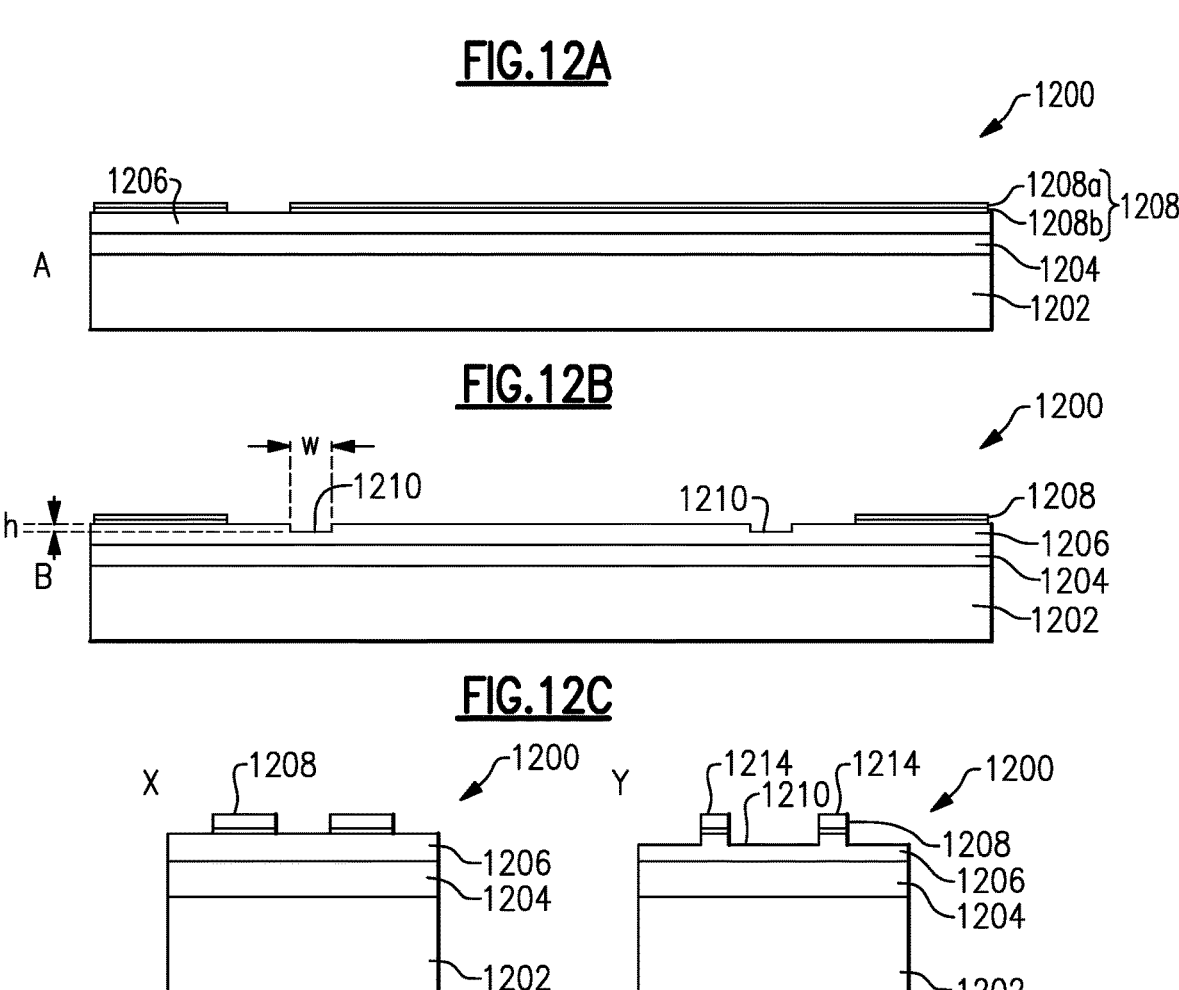
FIG.12B
FIG.12C
FIG.12D          FIG.12E

B    G   E         C         E   G    B

1606

1650

508                      510

B    G   E         C         E   G    B

1608

508

512     510            506      512

ACTIVE REGION

METHOD OF MANUFACTURE OF ACOUSTIC WAVE DEVICE WITH TRENCH PORTIONS FOR TRANSVERSE MODE SUPPRESSION

CROSS-REFERENCE TO RELATED APPLICATIONS

This application claims priority under 35 U.S.C. § 119(e) to U.S. Provisional Patent Application Ser. No. 63/362,682, titled "METHOD OF MANUFACTURE OF ACOUSTIC WAVE DEVICE WITH TRENCH PORTIONS FOR TRANSVERSE MODE SUPPRESSION," filed Apr. 8, 2022, to U.S. Provisional Patent Application Ser. No. 63/362,679, titled "ACOUSTIC WAVE DEVICE WITH TRENCH PORTIONS FOR TRANSVERSE MODE SUPPRESSION," filed Apr. 8, 2022, and to U.S. Provisional Patent Application Ser. No. 63/362,680, titled "ACOUSTIC WAVE DEVICE WITH TRENCH PORTIONS AND NARROW INTERDIGITAL TRANSDUCER TIP PORTIONS FOR TRANSVERSE MODE SUPPRESSION," filed Apr. 8, 2022, the entire content of each is incorporated herein by reference for all purposes.

BACKGROUND

Field

Aspects and embodiments disclosed herein relate to a method of manufacture of an acoustic wave device. In particular, embodiments of the invention relate to a method of manufacture of an acoustic wave device including trench portions in a piezoelectric layer for transverse mode suppression.

Description of the Related Technology

Multilayer piezoelectric substrates (MPSs) are often used in acoustic wave devices, such as surface acoustic wave (SAW) devices. Several structures for suppressing unwanted transverse modes in such devices are known. However, the various known structures each have different drawbacks.

FIGS. 1A and 1B show one type of acoustic wave device 100. FIG. 1A is a cross-section through the line marked A on the plan view of FIG. 1B. The acoustic wave device 100 has a multilayer piezoelectric substrate (MPS) including a carrier substrate 102, a layer of dielectric material 104 disposed on an upper surface of the carrier substrate 102, and a layer of piezoelectric material 106 disposed on the layer of dielectric material 104. An interdigital transducer electrode (IDT) 108 is disposed on top of the layer of piezoelectric material 106. In the acoustic wave device 100 of FIGS. 1A and 1B, the electrode fingers in the IDT 108 include hammer head portions 110 to suppress the transverse modes. The hammer head portions 110 are sections of the electrode fingers in edge regions E of the IDT that have a width (in a direction perpendicular to the lengthwise extension of the electrode fingers) larger than the width of each finger in a central region C of the IDT 108. A duty factor (DF) of the IDT 108 is greater in the edge regions E of the IDT as compared to the duty factor of the IDT in the central region C of the IDT.

In general, the width of the IDT fingers compared to the width of the spacing between the IDT fingers sets the duty factor (DF). Specifically, the duty factor is defined as the fraction of the IDT width spanned by the width of the IDT fingers (in the direction of propagation of the main surface acoustic wave to be generated). Increasing the width of the IDT fingers, while maintaining the position of the center of each IDT finger, increases the duty factor.

The hammer head portions 110 of the device of FIGS. 1A and 1B reduce the acoustic velocity in the edge regions E compared to the central region C. This velocity reduction creates a piston mode distribution to reduce transverse modes. To obtain a large enough velocity difference for transverse mode suppression through a larger DF in the edge regions E, the DF of the central region C of the IDT should be less than 0.5. This is because the velocity of the main acoustic mode changes rapidly with DF when the DF is less than 0.5, compared to when DF is greater than 0.5 and the velocity of the main acoustic mode does not vary with DF as much. The use of a DF narrower than 0.5 in the central region C leads to a decrease in the static capacitance. A smaller static capacitance leads to a larger size device for a given impedance, as static capacitance sets the limit on the IDT size. Therefore, the hammer head structure of FIGS. 1A and 1B can lead to an undesirable increase in size of the acoustic wave device 100.

FIGS. 2A and 2B show another type of acoustic wave device 200. The acoustic wave device 200 of FIGS. 2A and 2B is identical to that of FIGS. 1A and 1B, except that the acoustic wave device 200 does not include the hammer head portions 110. Instead, the acoustic wave device 200 includes a passivation layer 210 of silicon nitride (SiN) disposed the IDT 208 that is thickest in the central region C of the IDT 208. The passivation layer 210 creates a piston mode distribution to suppress the transverse modes in a similar fashion to the acoustic wave device 100 of FIGS. 1A and 1B. However, a drawback of the thicker passivation layer 210 in the central region is that the electromechanical coupling coefficient (K2) is reduced.

FIGS. 3A and 3B show another similar acoustic wave device 300. Instead of the hammer head portions 110 or passivation layer 210, the acoustic wave device 300 includes a pair of mass loading strips 310 disposed over the edge regions E of the IDT 308. The mass loading strips are strips of a heavy dielectric material, or strips of heavy conductive material if suitably isolated, for example, by the thin passivation layer 312 shown in FIG. 3A. The mass loading strips 310 also suppress the transverse modes, however the central region C of the IDT can often become damaged during formation of the mass loading strips 310 on the edge regions E.

FIGS. 4A and 4B show another similar acoustic wave device 400. The acoustic wave device 400 of FIGS. 4A and 4B is identical to that of FIGS. 1A and 1B, except that the acoustic wave device 400 does not include the hammer head portions 110. Instead, thicker portions 410 are included, which are portions where the thickness of the IDT 408 in a direction perpendicular to the plane of the layer of piezoelectric material 406 has been increased in the edge regions E of the IDT 408. Such a configuration again establishes a piston mode distribution. However, formation of thicker portions 410 is difficult to achieve.

SUMMARY

According to one embodiment there is provided a method of manufacturing an acoustic wave device. The method comprises providing a layer of piezoelectric material, disposing a pair of interdigital transducer electrodes on an upper surface of the layer of piezoelectric material, each interdigital transducer electrode including a bus bar and a plurality of electrode fingers extending from the bus bar towards an edge region of the interdigital transducer electrode at the distal ends of the electrode fingers, and etching trench portions into the upper surface of the layer of piezoelectric material, the trench portions overlapping with the edge regions of the interdigital transducer electrodes.

In one example the method of manufacturing further comprises, before the etching, positioning an etch resistant mask to cover the pair of interdigital transducer electrodes and the upper surface of the layer of piezoelectric material other than in the edge regions.

In one example the etching includes etching the trench portions in the areas of the upper surface of the layer of piezoelectric material that are overlapped by the edge regions of the interdigital transducer electrodes and that are not covered by the interdigital transducer electrodes.

In one example the disposing the pair of interdigital transducer electrodes on the upper surface of the layer of piezoelectric material includes forming each interdigital transducer electrode from a single layer of etch resistant material.

In one example the etch resistant material is selected from the group consisting of copper, platinum, tungsten, molybdenum, ruthenium, iridium, gold, and silver.

In one example disposing the pair of interdigital transducer electrodes on the upper surface of the layer of piezoelectric material includes forming each interdigital transducer electrode from one or more lower layers of material and an upper layer of etch resistant material.

In one example the etch resistant material is selected from the group consisting of copper, platinum, tungsten, molybdenum, ruthenium, iridium, gold, and silver.

In one example disposing the pair of interdigital transducer electrodes on the upper surface of the layer of piezoelectric material includes forming upper layers of the plurality of electrode fingers with a lesser maximum width than the one or more lower layers of the plurality of electrode fingers.

In one example disposing the pair of interdigital transducer electrodes on the upper surface of the layer of piezoelectric material includes forming upper layers of the plurality of electrode fingers with trapezoidal cross-sections.

In one example the method of manufacturing further comprises, before the etching, applying a mask layer onto the upper surfaces of each of the pair of interdigital transducer electrodes.

In one example the mask layer is a layer of chromium.

In one example the method of manufacturing further comprises, after the etching, disposing a protective layer over the upper surfaces of the pair of interdigital transducer electrodes and the layer of piezoelectric material.

In one example the protective layer is formed from one or more of the group consisting of silicon nitride, silicon oxynitride, and silicon dioxide.

In one example the electrode fingers of each interdigital transducer electrode disposed on the upper surface of the layer of piezoelectric material interleave with one another in an active region of the pair of interdigital transducer electrodes, and form gap regions between the ends of the fingers of one of the interdigital transducer electrodes and the bus bar of the other interdigital transducer electrode.

In one example the trench portions etched into the upper surface of the layer of piezoelectric material also overlap with at least part of the gap regions.

In one example the method of manufacturing further comprises, before the etching, positioning an etch resistant mask to cover the pair of interdigital transducer electrodes and the upper surface of the layer of piezoelectric material other than in the edge regions and the at least part of the gap regions.

In one example disposing the pair of interdigital transducer electrodes on the upper surface of the layer of piezoelectric material includes disposing a second bus bar within the gap region.

In one example disposing the pair of interdigital transducer electrodes on the upper surface of the layer of piezoelectric material includes forming dummy electrodes extending from the second bus bar partially through the gap region toward an adjacent edge region In one example the active region includes a central region and the edge regions of the interdigital transducer electrodes, each edge region extending from the tips of the plurality of electrode fingers of one of the interdigital transducer electrodes towards the center of the central region.

In one example each of the plurality of electrode fingers of the interdigital transducer electrodes disposed on the upper surface of the layer of piezoelectric material has a width in a direction perpendicular to the extension of the electrode fingers that is smaller in the edge regions than in the central regions.

In one example, the etching includes etching using at least one of chemical etching, laser etching, dry etching, vapor phase etching, wet etching, and/or plasma etching.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the disclosed aspects and embodiments. In the figures, each identical or nearly identical component that is illustrated in various figures is represented by a like numeral. For purposes of clarity, not every component may be labeled in every figure. In the figures:

FIG. 5A is a plan view of an acoustic wave device according to aspects of the present disclosure;

FIG. 5B is a cross-sectional view of the acoustic wave device of FIG. 5A;

FIG. 5C is a cross-sectional view of the acoustic wave device of FIG. 5A;

FIG. 5D is a cross-sectional view of the acoustic wave device of FIG. 5A;

FIG. 5E is a cross-sectional view of the acoustic wave device of FIG. 5A;

FIG. 7A is a graph showing a comparison of admittance curves of an acoustic wave device according to aspects disclosed herein and an acoustic wave device according to FIG. 4A;

FIG. 7B is a graph showing a comparison of admittance curves of an acoustic wave device according to aspects disclosed herein with an acoustic wave device according to FIG. 4A;

FIG. 7C is a graph showing a comparison of quality factor curves of an acoustic wave device according to aspects disclosed herein with an acoustic wave device according to FIG. 4A;

FIG. 12A is a plan view of an acoustic wave device according to aspects disclosed herein;

FIG. 12B is a cross-sectional view of the acoustic wave device of FIG. 12A;

FIG. 12C is a cross-sectional view of the acoustic wave device of FIG. 12A;

FIG. 12D is a cross-sectional view of the acoustic wave device of FIG. 12A;

FIG. 12E is a cross-sectional view of the acoustic wave device of FIG. 12A;

FIG. 17D is a cross-sectional view of the acoustic wave device of FIG. 17A;

FIG. 17E is a cross-sectional view of the acoustic wave device of FIG. 17A;

FIG. 18D is a cross-sectional view of the acoustic wave device of FIG. 18A;

FIG. 18E is a cross-sectional view of the acoustic wave device of FIG. 18A;

FIG. 19A is a plan view of an acoustic wave device according to aspects disclosed herein;

FIG. 19B is a cross-sectional view of the acoustic wave device of FIG. 19A;

FIG. 19C is a cross-sectional view of the acoustic wave device of FIG. 19A;

FIG. 19D is a cross-sectional view of the acoustic wave device of FIG. 19A;

FIG. 19E is a cross-sectional view of the acoustic wave device of FIG. 19A;

DETAILED DESCRIPTION

Figure 1A:
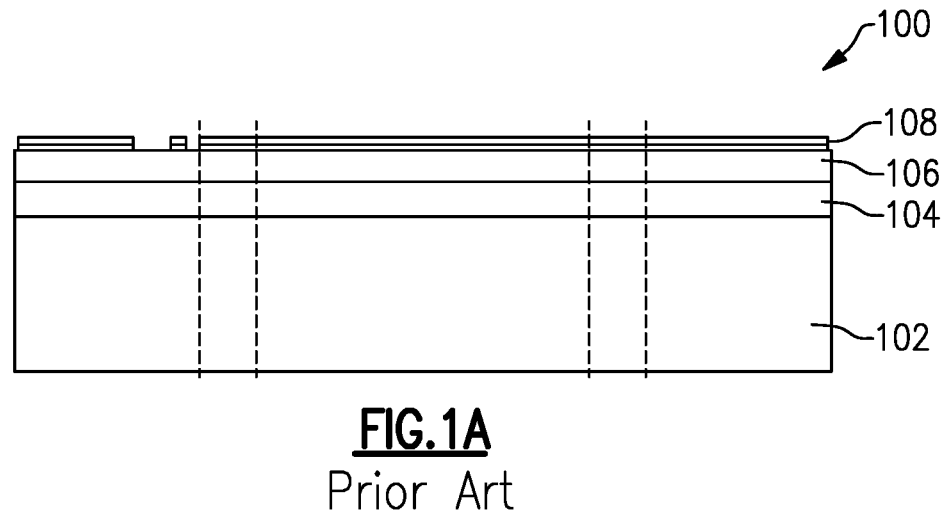
FIG. 1A is a cross-sectional side view of an acoustic wave device of the prior art.
Figure 1B:
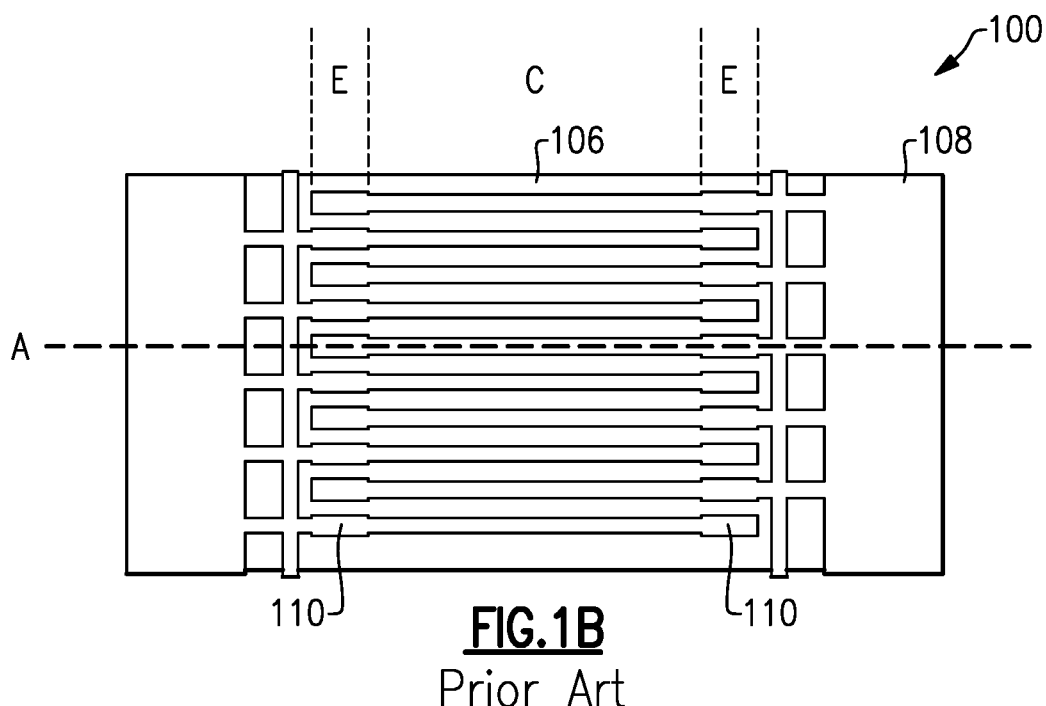
FIG. 1B is a plan view of the acoustic wave device of FIG. 1A.
Figure 2A:
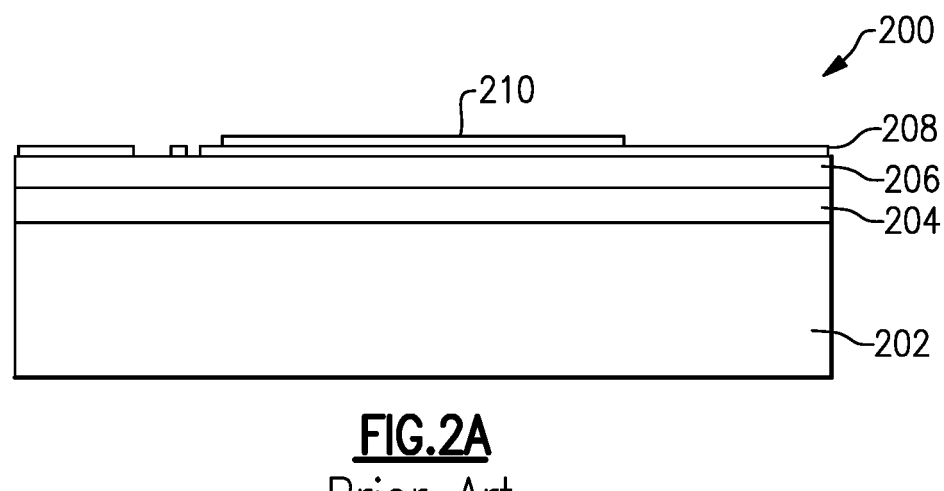
FIG. 2A is a cross-sectional side view of an acoustic wave device of the prior art.
Figure 2B:
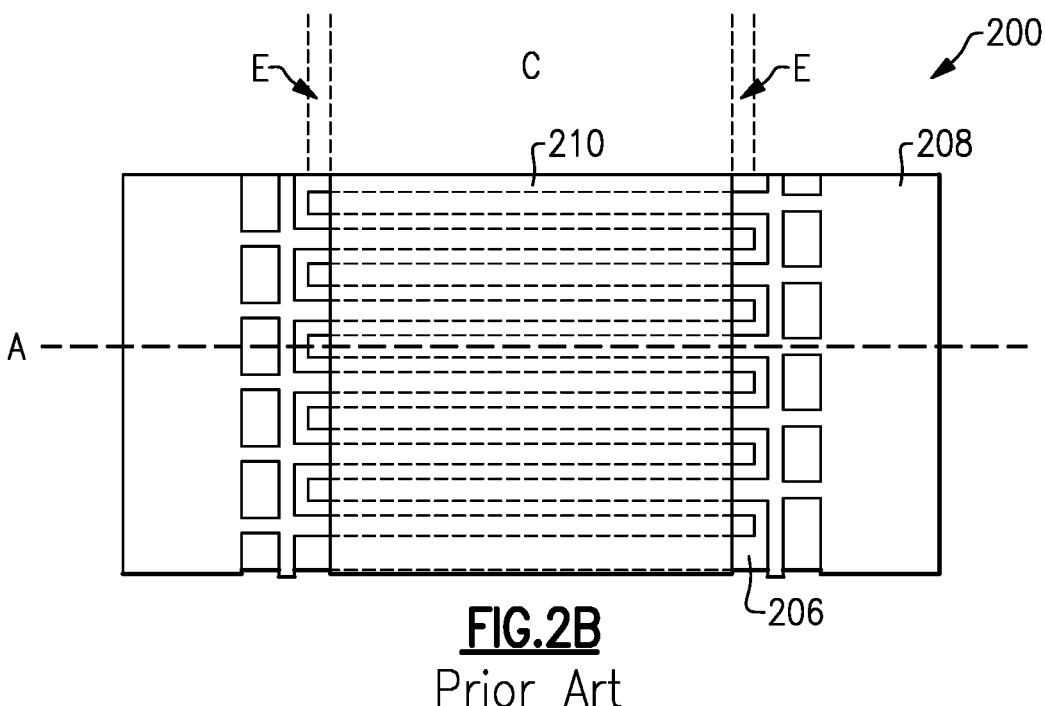
FIG. 2B is a plan view of the acoustic wave device of FIG. 2A.

This application relates to a method of manufacturing an acoustic wave device. The method of manufacturing an acoustic wave device comprises providing a layer of piezoelectric material, disposing a pair of interdigital transducer electrodes on an upper surface of the layer of piezoelectric material, each interdigital transducer electrode including a bus bar and a plurality of electrode fingers extending from the bus bar towards an edge region of the interdigital transducer electrode at the distal ends of the electrode fingers, and etching trench portions into the upper surface of the layer of piezoelectric material, the trench portions overlapping with the edge regions of the interdigital transducer electrodes. The formation of the trench portions through etching results in an easier fabrication, that is less likely to damage the interdigital transducer electrodes.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. single, more than one, and all of the described terms.

Aspects and embodiments of the present disclosure are described below through embodiments of acoustic wave devices, in particular surface acoustic wave (SAW) devices. However, as would be understood by the skilled person, various different excitation modes are possible in acoustic wave filters and devices, particularly MPS devices. As well as surface acoustic waves other types of acoustic wave are possible such as boundary acoustic waves and guided acoustic waves. References to surface acoustic waves and surface acoustic wave (SAW) devices in the following description are not intended to limit the disclosure from including or covering other possible types of acoustic waves and acoustic wave devices.

Figures 5A, 5B, 5C, 5D:
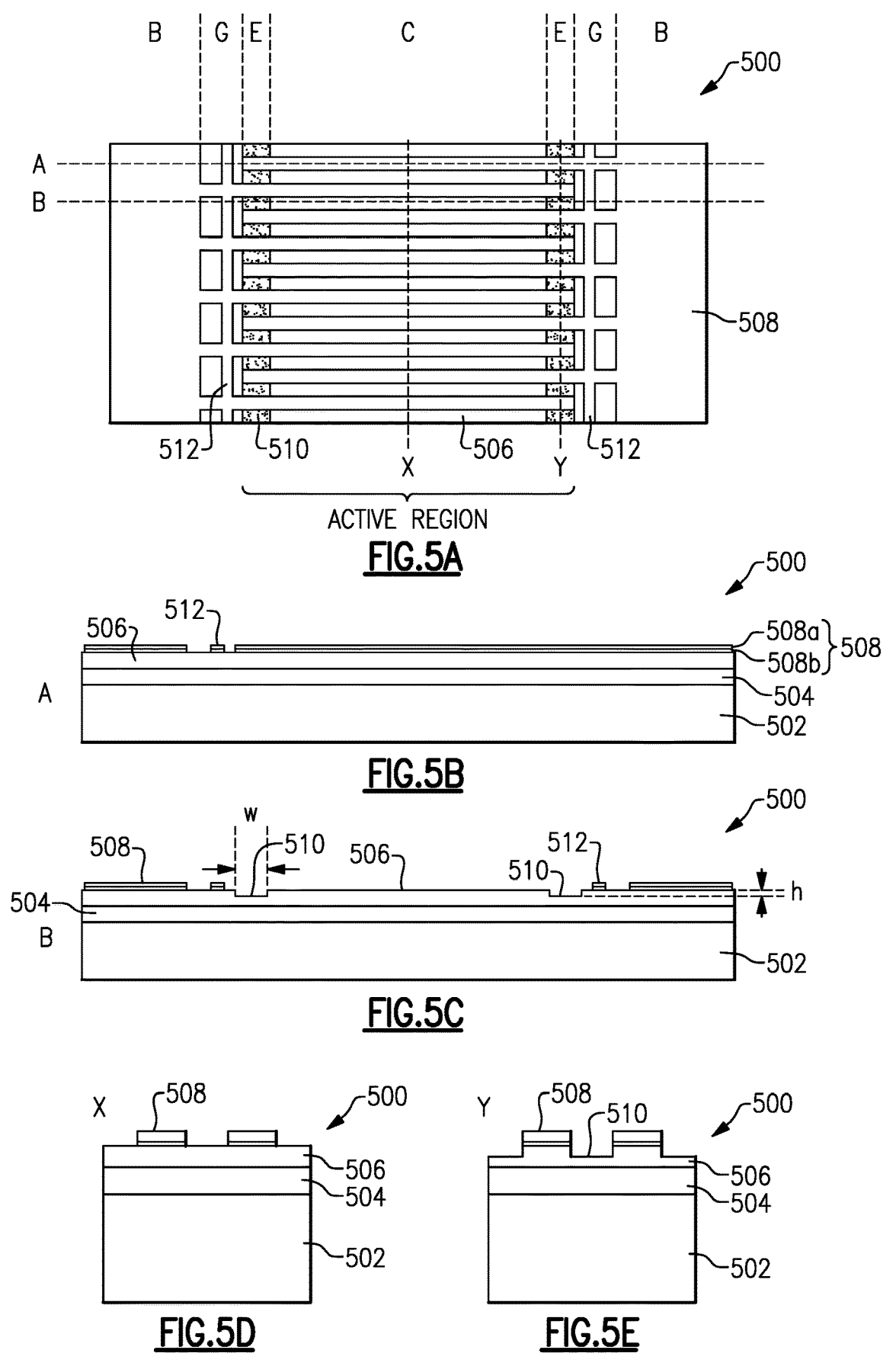

FIG. 5A is a plan view of a surface acoustic wave (SAW) device according to a first embodiment. FIGS. 5B and 5C show cross-sections through the lines in FIG. 5A labeled A and B respectively. FIGS. 5D and 5E show partial cross-sections through the lines in FIG. 5A labeled X and Y respectively (with only two IDT fingers shown in FIGS. 5D and 5E for clarity).

The acoustic wave device 500 includes a carrier substrate 502, a layer of dielectric material 504 disposed on an upper surface of the carrier substrate 502, and a layer of piezoelectric material 506 disposed above the layer of dielectric material 504 on the upper surface of the carrier substrate 502. Together the carrier substrate 502, layer of dielectric material 504, and layer of piezoelectric material 506 may be referred to as a multilayer piezoelectric substrate (MPS).

Any piezoelectric material may be used as the layer of piezoelectric material 506, for example, including but not limited to lithium tantalate (LiTaO$_3$), aluminum nitride (AlN), lithium niobate (LiNbO$_3$), or potassium niobate (KNbO$_3$). Various materials may also be used in the layer of dielectric material 504 and in the carrier substrate 502. One example of a material that may be utilized for the layer of dielectric material 504 is silicon dioxide (SiO$_2$). Other examples may include doped materials such as F doped SiO$_2$, or Ti doped SiO$_2$. One example of a material that may be utilized for the carrier substrate 502 is silicon (Si), however aluminum nitride, silicon nitride, magnesium oxide spinel, magnesium oxide crystal, quartz, diamond, DLC (diamond-like carbon) and sapphire may all also be used as the carrier substrate.

The carrier substrate 502 may be formed of a material having a lower coefficient of linear expansion and/or a higher thermal conductivity and/or a higher toughness or mechanical strength than the piezoelectric material. The carrier substrate 502 may both increase the mechanical robustness of the piezoelectric material during fabrication of the SAW device and increase manufacturing yield, as well as reducing the amount by which operating parameters of the SAW device change with temperature during operation. The carrier substrate 502 may be referred to as a high impedance support substrate.

An interdigital transducer (IDT) 508 is disposed on top of the layer of piezoelectric material 506 and is configured to generate a surface acoustic wave in the multilayer piezoelectric substrate. In use, the IDT 508 excites a main acoustic wave having a wavelength λ along a surface of the multilayer piezoelectric substrate. The acoustic wave is concentrated in the top two layers (the layer of dielectric material 504 and layer of piezoelectric material 506). The carrier substrate 502 (in this case silicon) may have a high impedance meaning the acoustic wave is reflected at the boundary between the carrier substrate 502 and the layer of dielectric material 504, confining the surface acoustic wave in the top two layers. In some embodiments, the thickness of the layer of dielectric material 504 may be between 0.1λ and 1λ, preferably between 0.1λ and 0.5λ, and the thickness of the layer of piezoelectric material 506 may be between 0.1λ and 1λ, preferably between 0.1λ and 0.5λ. It is to be understood that the dimensions above are only examples and may be set at different values in different embodiments of acoustic wave devices to achieve different design goals.

Any type of IDT may be used as the IDT 508 in the acoustic wave device 500. For example, a typical IDT will include a pair of interlocking comb shaped IDT electrodes.

Each electrode of the IDT typically includes a bus bar and a plurality of electrode fingers that extend perpendicularly from the bus bar. Typically, the distance between the central point of each adjacent electrode finger extending from the same bus bar is equal to the wavelength λ of the surface acoustic wave generated. The bus bars of each of the pair or IDT electrodes are parallel and opposing each other, and the plurality of electrode fingers of each IDT electrode extend towards to the bus bar of the opposing electrode, such that the electrode fingers interlock, typically with a distance of λ/2 between the centers of each set of adjacent electrode fingers extending from opposite bus bars. The main surface acoustic wave generated by the IDT travels perpendicular to the lengthwise direction of the IDT electrode fingers, and parallel to the lengthwise direction of the IDT bus bars.

Regardless of the type of IDT used, the IDT 508 has an active region defined as the region that the fingers of each interdigital transducer electrode interleave with one another. The surface acoustic wave is generated in the active region of the IDT. The active region of the IDT includes a central region and two edge regions. The central region is labeled by the letter C in FIG. 5A and the edge regions are labeled by the letter E. Each edge region E extends from the tips of the plurality of fingers of one of the electrodes towards the center of the central region C. The edge regions E include end portions of the IDT electrode fingers, and the central region C is sandwiched between the edge regions. The purpose of the edge regions will be discussed in more detail below. The IDT also includes gap regions labeled by the letter G in FIG. 5A. The gap regions are located between the ends of the fingers of one of the electrodes and the bus bar of the other electrode. The regions containing the bus bars are labeled B in FIG. 5A. The dashed lines in FIG. 5A show the boundaries between the above described regions.

In the embodiment of FIG. 5A, the IDT electrodes 508 each include a second bus bar 512 that is located within the gap region G. The second bus bars 512 extend parallel to the bus bars, and are located adjacent to the edge regions E of the IDT 508. The second bus bars 512 are thinner than the bus bars, and may be referred to as "mini bus bars". The mini bus bars result in the transverse modes being suppressed more effectively However, in some embodiments these mini bus bars may be omitted (see the discussion relating to FIGS. 10A to 11C below).

In the embodiments of FIGS. 5A to 5E a double layer IDT 508 is used, with an upper IDT layer 508a and a lower IDT layer 508b. However single layer IDTs may also be used. In general, various IDT structures are possible, as would be understood by the skilled person, for example double electrode IDTs, or IDTs with dummy electrode fingers may be used. Specific IDT configurations will be discussed in more detail later, taking into consideration the method of manufacture of the device. More detail on specific materials that the IDT 508 may be formed of will also be discussed later.

The acoustic wave device 500 further includes trench structures in the layer of piezoelectric material for suppressing the transverse modes. Trench portions 510 are located in the upper surface of the layer of piezoelectric material. The trench portions 510 overlap with the edge regions E of the IDT electrodes 508. The trench portions 510 are located within the active region of the IDT 508, in the edge regions E of the IDT 508, and form a boundary of the active region running parallel with the bus bars. The trench portions 510 slow down the acoustic velocity at edge of the active region to set up piston mode distribution, and thus suppress the transverse modes.

As can be seen from FIG. 5A, the trench portions 510 extend parallel to the bus bars, in the direction of propagation of the main acoustic wave generated by the IDT 508. However, the trench portions are only present in the sections of the upper surface of the layer of piezoelectric material 506 that are overlapped by the edge regions E of the IDT 508 and are not covered by the material of the IDT 508. The trench portions 510 are only cut into the surface of the layer of piezoelectric material 506 that is exposed after the IDT 508 has been formed on the layer of piezoelectric material 506. The trench portions 510 are not cut into the sections of the layer of piezoelectric material 506 covered by the IDT 508, meaning the trench portions 510 do not run underneath the IDT 508. The layer of piezoelectric material 506 remains at full thickness underneath the IDT 508. This is best seen in FIG. 5E, showing the trench portions 510 cut into the upper surface of the layer of piezoelectric material 506 not covered by the IDT 508, and not cut into the upper surface of the layer of piezoelectric material 506 covered by the IDT 508. A comparison of the cross-sectional views of FIGS. 5B and 5C also shows this. Therefore, the trench portions 510 can be described as extending discontinuously in the direction of propagation of the main acoustic wave generated by the IDT 508 (along the line marked Y in FIG. 5A).

The trench portions 510 can be formed in this way by etching the piezoelectric substrate. In particular, the trenches portions 510 may be etched after the formation of the IDT 508 on the upper surface of the layer of piezoelectric material 506, with the IDT preventing etching of the layer of piezoelectric material 506 underneath the IDT. The method of manufacture of the device will be discussed in more detail later, in relation to FIGS. 16A to 18E.

In some embodiments, the trench portions may each have a width (marked w in FIG. 5C) in a direction perpendicular to the direction of propagation of an acoustic wave to be generated by the IDT 508 of between about 0.5λ, and 1λ, where λ is the wavelength of the main acoustic wave to be generated by the IDT 508. In some embodiments, the trench portions may each have a depth (marked h in FIG. 5C) relative to the upper surface of the layer of piezoelectric material of between about 0.004λ and 0.02λ, where λ is the wavelength of the main acoustic wave to be generated by the IDT 508. The effect of the variation of the width w and depth h will be discussed in more detail in relation to FIGS. 8A to 9C.

As best seen in FIG. 5E, due to the trench portions 510 the sections of the electrode fingers of the IDT 508 in the edge regions E (the tips of the electrode fingers) are positioned higher relative to the surface of the layer of piezoelectric material 506 at the bottom of the trench portions. Therefore, the trench portions 510 increase the effective thickness of the IDT electrodes 508 seen by the acoustic wave within the edge regions E. The increased effective thickness of the IDT 508 in the edge regions E results in the piston mode distribution, which suppresses the transverse modes.

The acoustic wave device 500 has a number of advantages compared to the prior art devices of FIGS. 1A to 4B. Firstly, due to the trench portions 510 the piston mode distribution can be implemented without a decrease in the duty factor of the of the central region C of the IDT 508, preventing an unwanted decrease in static capacitance and thus increase in size of the device. Specifically, in the acoustic wave device 500 of FIGS. 5A to 5E, a DF of 0.5 is used in the IDT 508, which is good for size reduction. In addition, as discussed in more detail below, the trench portions 510 can be formed through etching, resulting in easier fabrication in which the central region C is less easily damaged. Lastly, the combination of the trench portions 510 with the MPS results in a device with a high Q-factor, high electromechanical coupling coefficient (K2), excellent temperature coefficient of frequency (TCF), and high power durability.

Figures 6A, 6B, 6C:
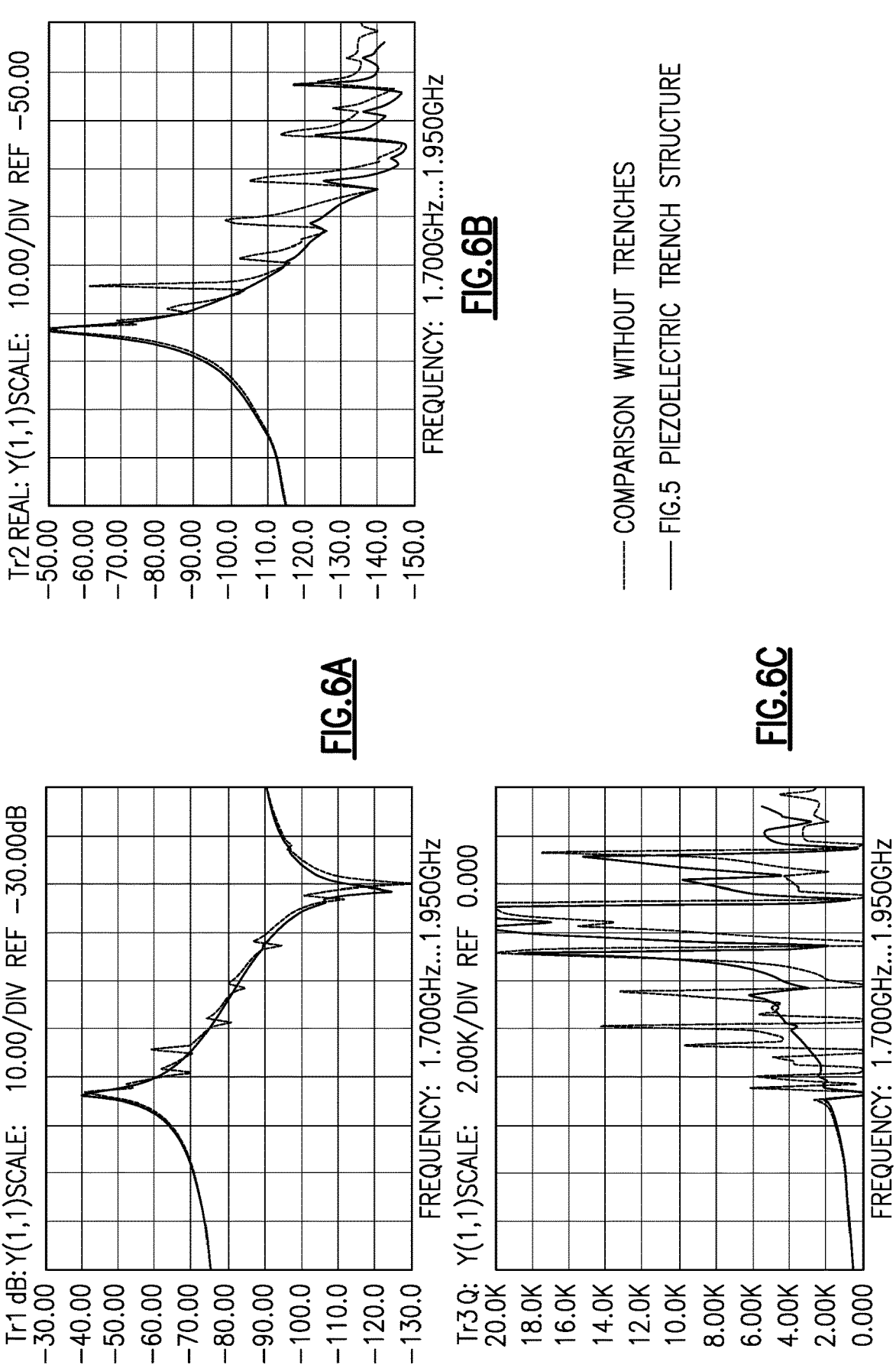
FIG. 6A is a graph showing a comparison of admittance curves of an acoustic wave device according to aspects disclosed herein and an acoustic wave device without trench portions.
FIG. 6B is a graph showing a comparison of admittance curves of an acoustic wave device according to aspects disclosed herein with an acoustic wave device without trench portions.
FIG. 6C is a graph showing a comparison of quality factor curves of an acoustic wave device according to aspects disclosed herein with an acoustic wave device without trench portions.

FIGS. 6A to 6C are simulation graphs showing a comparison between admittance curves (complex FIG. 6A, and real FIG. 6B) and quality factor curves (Q-factor, FIG. 6C) of an acoustic wave device as disclosed herein with trench portions and a comparative example without trench portions. In particular, the graphs of FIGS. 6A to 6C include a solid line trace showing the simulation results for the acoustic wave device 500 of FIGS. 5A to 5E with a width w of the trench portions 510 equal to 1λ and a depth of 0.007λ, where λ is the wavelength of the main acoustic wave to be generated by the IDT 508. The dashed line trace is for the comparative example, which is identical to the acoustic wave device 500 of the solid line trace except that is does not include the trench portions.

As can be seen from the graphs of FIGS. 6A and 6B, many transverse modes are present in the dashed line trace of the comparative example. In the solid line trace for the acoustic wave device 500 with trench portions 510, on the other hand, the transverse modes are greatly suppressed.

Figure 4A:
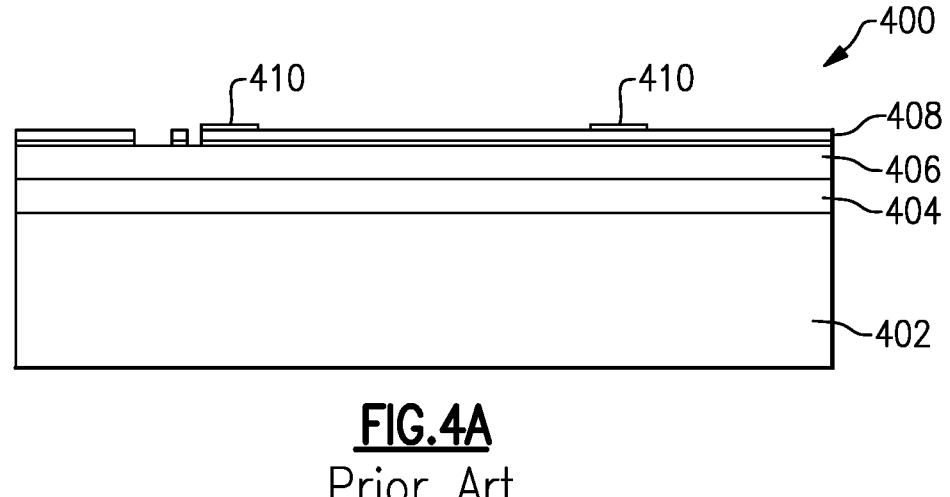
FIG. 4A is a cross-sectional side view of an acoustic wave device of the prior art.
Figure 4B:
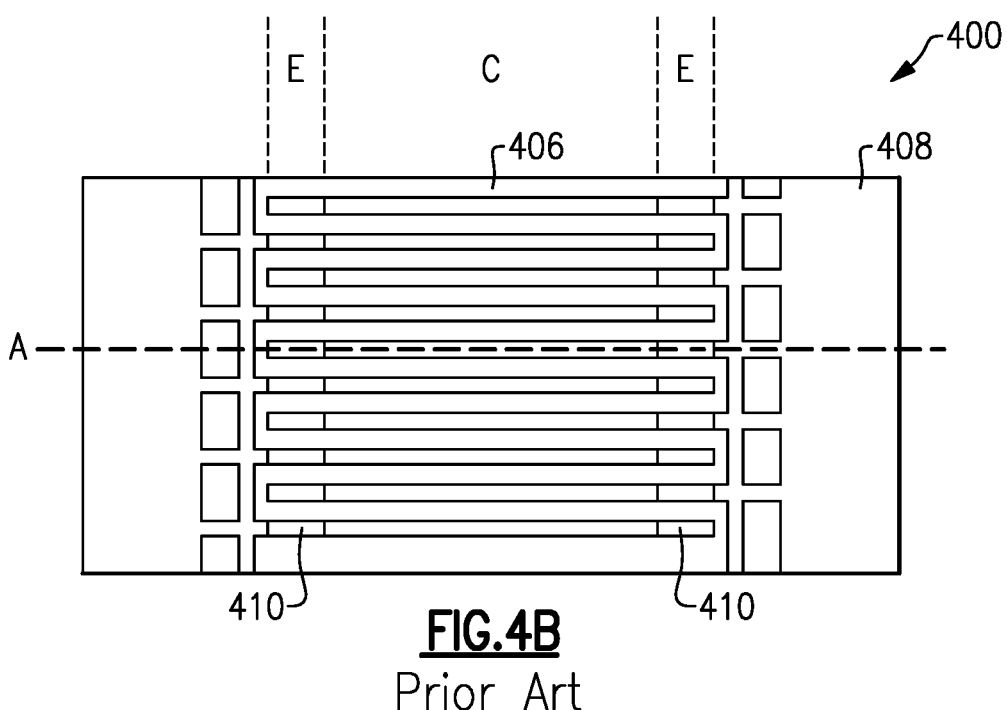
FIG. 4B is a plan view of the acoustic wave device of FIG. 4B.

FIGS. 7A to 7C show a second comparison simulation study. The graphs of FIGS. 7A to 7C are the same as FIGS. 6A to 6C, except that in FIGS. 7A to 7C the prior art acoustic wave device 400 of FIGS. 4A and 4B is used as the comparative example (the dashed line trace). The simulation of the acoustic wave device 400 is based on molybdenum thicker portions 410 with a width of 1λ (in the direction of the extension of the electrode fingers) and a height of 0.003λ. As can be seen from the graphs, the performance of the acoustic wave device 500 of FIGS. 5A to 5E is similar, but slightly improved compared to the comparative example. An improvement can be seen in the Q-factor graph of FIG. 7C in particular.

The effect of variation of width w and depth h of the trench portions 510 will now be discussed in relation to FIGS. 8A to 9C.

Figures 8A, 8B, 8C:
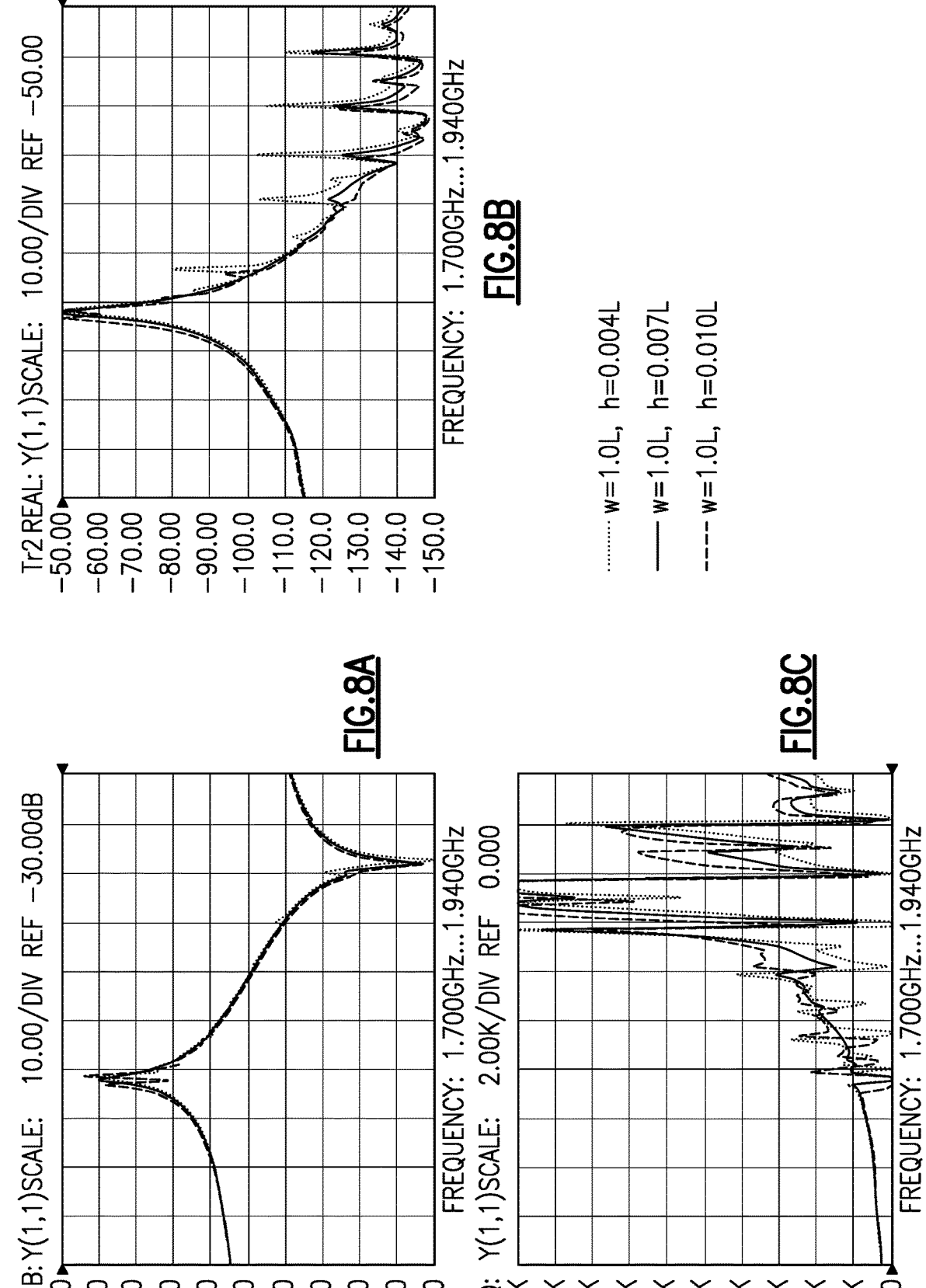
FIG. 8A is a graph showing a comparison of admittance curves of acoustic wave devices according to aspects disclosed herein.
FIG. 8B is a graph showing a comparison of admittance curves of acoustic wave devices according to aspects disclosed herein.
FIG. 8C is a graph showing a comparison of quality factor curves of acoustic wave devices according to aspects disclosed herein.

FIGS. 8A to 8C are simulation graphs showing a comparison between admittance curves (complex FIG. 8A, and real FIG. 8B) and quality factor curves (Q-factor, FIG. 8C) of acoustic wave devices disclosed herein. In FIGS. 8A to 8C, the dotted line trace is simulated for the acoustic wave device 500 of FIGS. 5A to 5E with w=1λ and h=0.004λ, the solid line trace for the acoustic wave device 500 with w=1λ and h=0.007λ, and the dashed line trace for the acoustic wave device 500 with w=1λ and h=0.010λ, where λ is the wavelength of the main acoustic wave to be generated by the IDT 508. FIGS. 8A to 8C therefore show the effect of varying the depth h of the trench portions 510 of the acoustic wave device 500 of FIGS. 5A to 5E with a width fixed at 1λ.

As can be seen from FIGS. 8A to 8C, with trench portions 510 with a depth of h=0.004λ there is only a small amount of suppression of the transverse modes. A depth of h=0.007λ results in a more effective suppression of the transverse modes. A depth of h=0.010λ results in even more suppression of the transverse modes, however the additional depth of h=0.010λ also begins to cause a split in the main resonance peak. Therefore, for a width of w=1λ, trench portions with a depth h of between about 0.004λ and 0.010λ is preferred for transverse mode suppression.

Figures 9A, 9B, 9C:
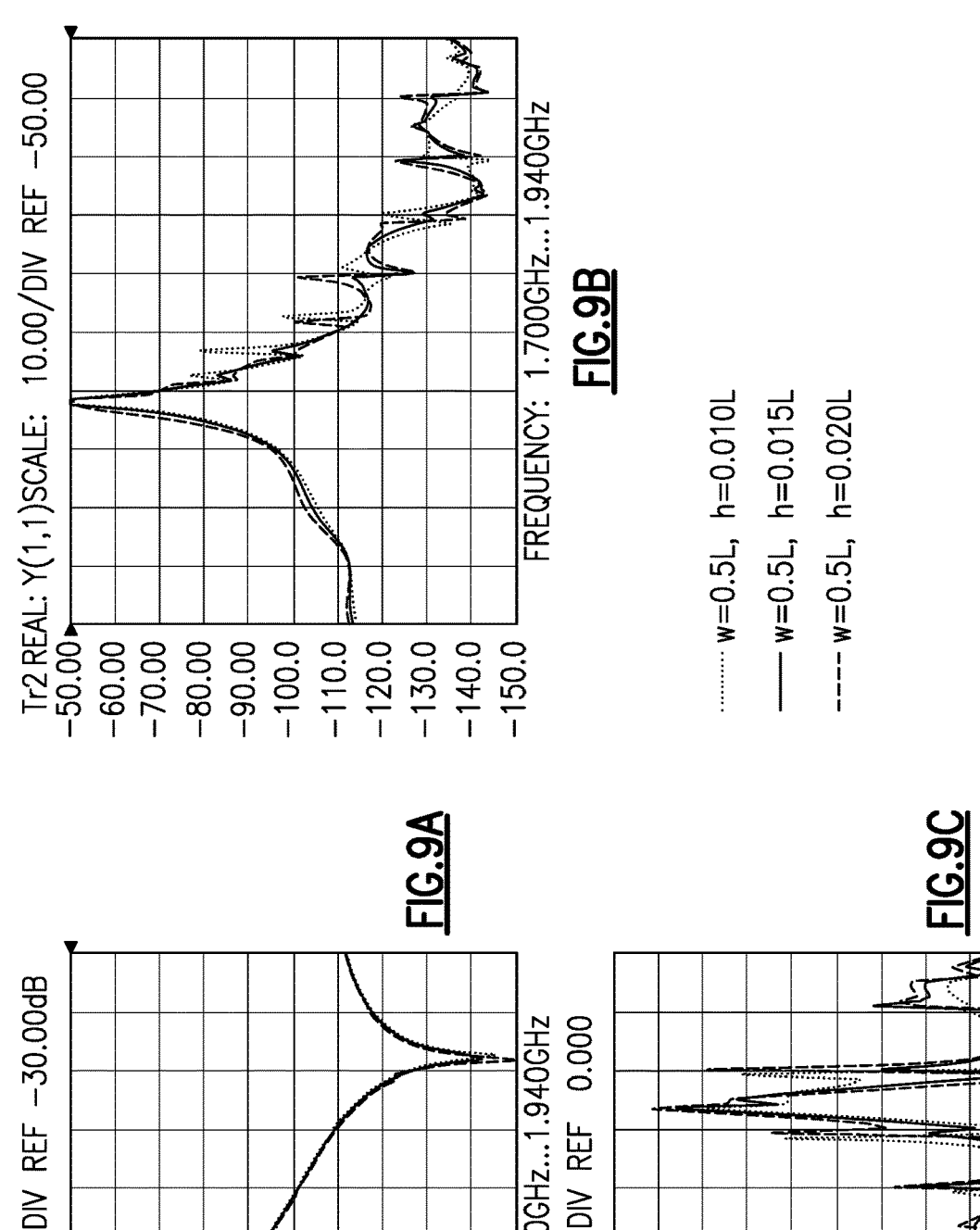
FIG. 9A is a graph showing a comparison of admittance curves of acoustic wave devices according to aspects disclosed herein.
FIG. 9B is a graph showing a comparison of admittance curves of acoustic wave devices according to aspects disclosed herein.
FIG. 9C is a graph showing a comparison of quality factor curves of acoustic wave devices according to aspects disclosed herein.

FIGS. 9A to 9C show similar simulation graphs, using widths of the trench portions 510 of w=0.5λ for each trace, and depths of h=0.010λ for the dotted line trace, h=0.015λ for the solid line trace, and h=0.020λ for the dashed line trace, where λ is the wavelength of the main acoustic wave to be generated by the IDT 508. FIGS. 9A to 9C therefore show the effect of varying the depth h of the acoustic wave device 500 of FIGS. 5A to 5E with a width fixed at 0.5λ. For a width of w=0.5λ, trench portions with a depth h of between about 0.010λ and 0.020λ is preferred for transverse mode suppression.

As can be seen from a comparison of FIGS. 8C and 9C, the Q-factor is larger, and therefore improved, when a width of w=1λ is used for the trench portions 510, compared to w=0.5λ. Therefore, a width w=1λ is preferred.

Figures 10A, 10B, 10C:
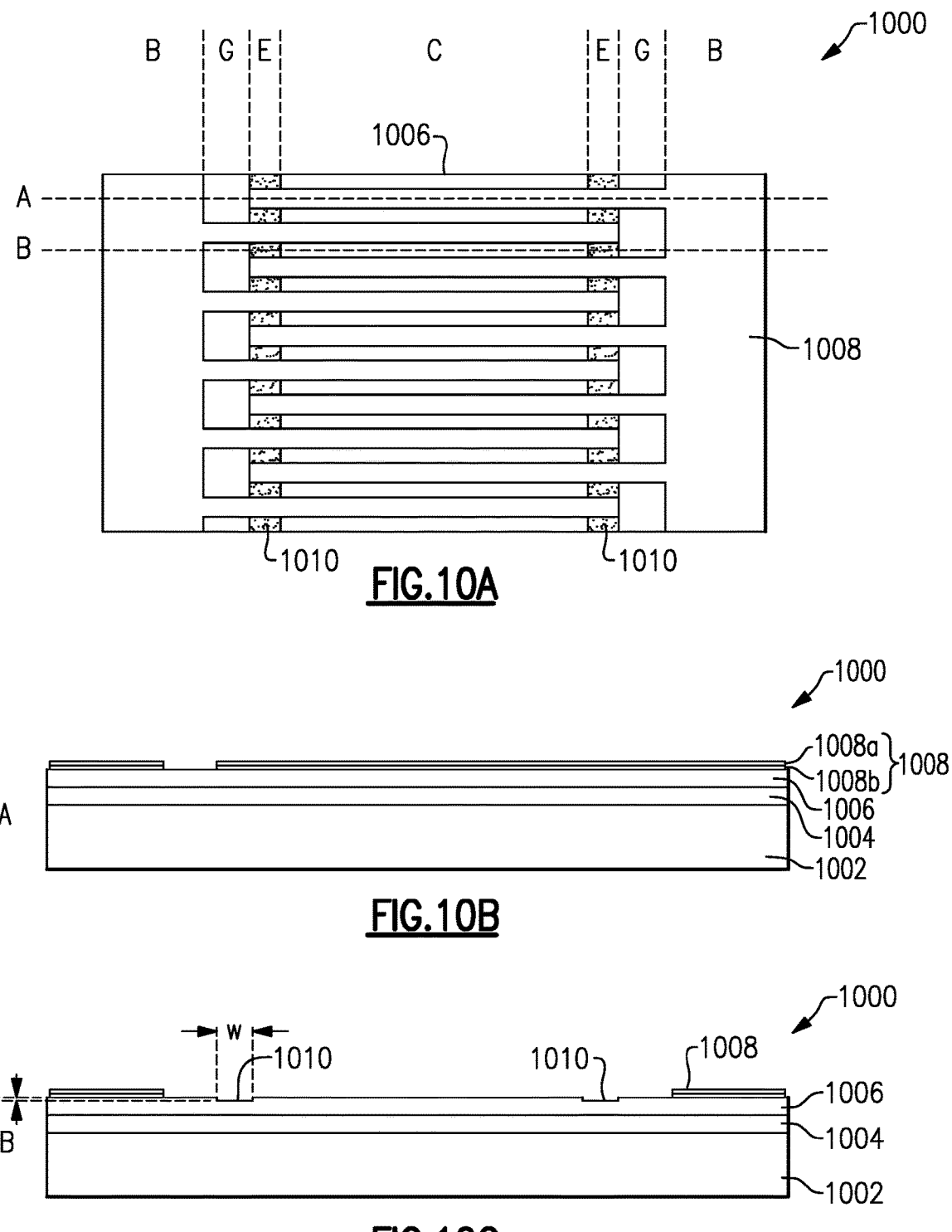
FIG. 10A is a plan view of an acoustic wave device according to aspects disclosed herein.
FIG. 10B is a cross-sectional view of the acoustic wave device of FIG. 10A.
FIG. 10C is a cross-sectional view of the acoustic wave device of FIG. 10A.

FIGS. 10A to 10C show an acoustic wave device 1000 in another embodiment. The acoustic wave device 1000 includes a carrier substrate 1002, a layer of dielectric material 1004, a layer of piezoelectric material 1006, an IDT 1008 with an upper layer 1008a and a lower layer 1008b, and trench portions 1010 located in the upper surface of the layer of piezoelectric material. The acoustic wave device 1000 is identical to the acoustic wave device 500 of FIGS. 5A to 5E except that the IDT 1008 of the acoustic wave device 1000 does not include the mini bus bars (second bus bars 512). The cross-sectional views equivalent to those in FIGS. 5D and 5E would be identical for the acoustic wave device 1000 and have therefore been omitted.

Figures 11A, 11B, 11C:
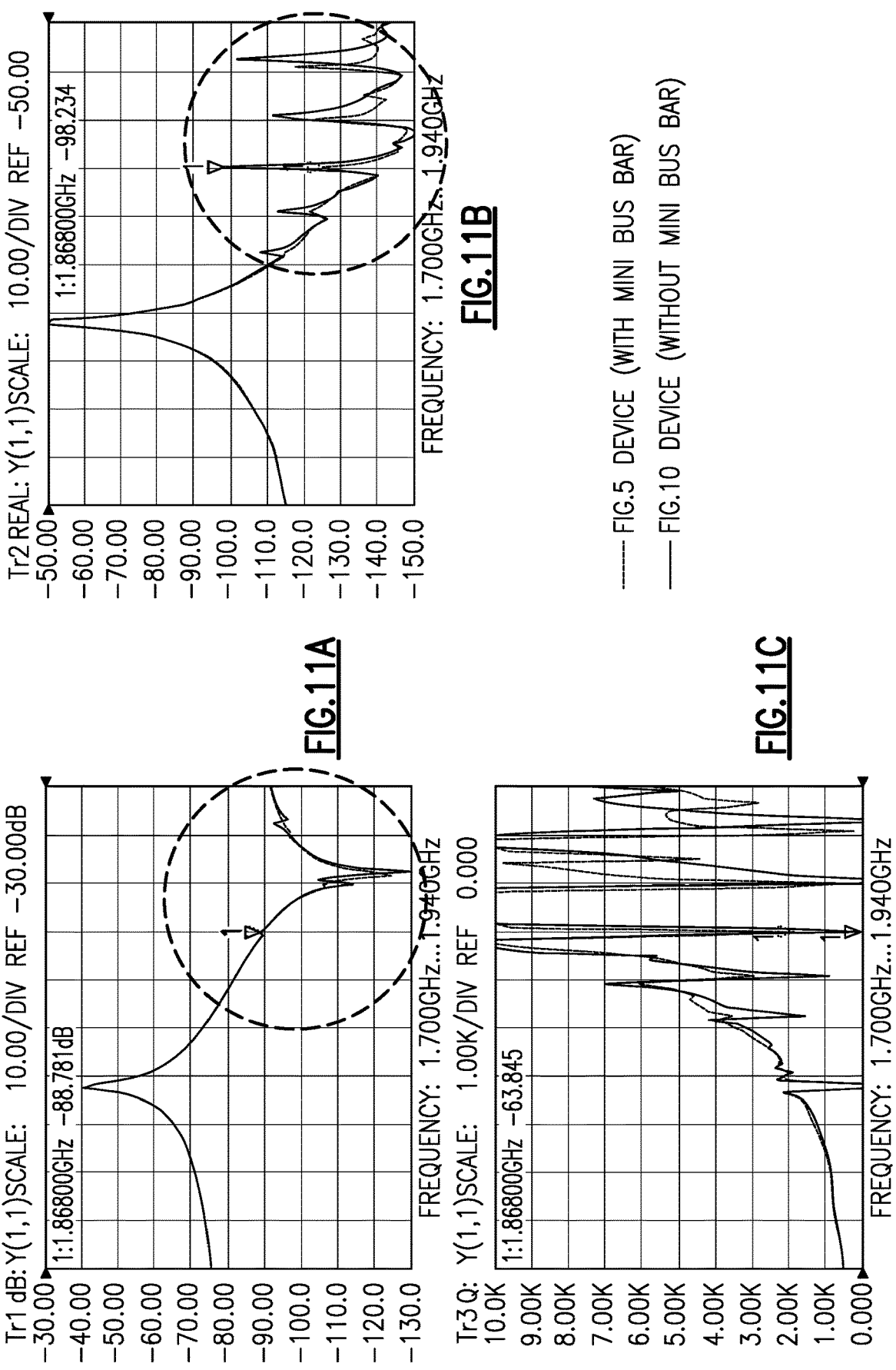
FIG. 11A is a graph showing a comparison of admittance curves of acoustic wave devices according to aspects disclosed herein.
FIG. 11B is a graph showing a comparison of admittance curves of acoustic wave devices according to aspects disclosed herein.
FIG. 11C is a graph showing a comparison of quality factor curves of acoustic wave devices according to aspects disclosed herein.

FIGS. 11A to 11C are simulation graphs showing a comparison between admittance curves (complex FIG. 11A, and real FIG. 11B) and quality factor curves (Q-factor, FIG. 11C) of acoustic wave devices disclosed herein. In FIGS. 11A to 11C the dashed line trace shows the simulation for the acoustic wave device 500 of FIGS. 5A to 5E, and the solid line trace shows the simulation for the acoustic wave device 1000 of FIGS. 10A to 10C. Both traces are based on simulations for devices with w=1λ and h=0.007λ for the trench portions 510 and 1010, where λ is the wavelength of the main acoustic wave to be generated by the IDT.

As highlighted in the dashed circles in FIGS. 11A and 11B, the suppression of the transverse modes is improved when the acoustic wave device includes the mini bus bars 512, compared to when the mini bus bars are omitted. Therefore, adding the mini bus bars 512 of FIG. 5A improves suppression of higher order transverse modes. Although inclusion of the mini bus bars 512 is optional, it is preferable.

FIGS. 12A to 12E show an acoustic wave device 1200 in another embodiment. The acoustic wave device 1200 includes a carrier substrate 1202, a layer of dielectric material 1204, a layer of piezoelectric material 1206, an IDT 1280 with an upper layer 1208a and a lower layer 1208b, and trench portions 1210 located in the upper surface of the layer of piezoelectric material. The acoustic wave device 1200 is identical to the acoustic wave device 1000 of FIGS. 10A to 10C except that the IDT 1208 of the acoustic wave device 1200 further includes narrow tip portions 1214 in the IDT fingers. The narrow tip portions 1214 in conjunction with the trench portions 1210 suppress the transverse modes.

In more detail, the narrow tip portions 1214 are sections of each of the plurality of electrode fingers in the IDT electrodes 1208 that have a width in a direction perpendicular to the extension of the electrode fingers that is smaller in the edge regions E of the IDT electrodes than in the central regions C of the IDT electrodes. The narrow tip portions 1214 are located in the edge region E of each IDT electrode. The distal ends of the plurality of electrode fingers in each IDT electrode (the ends furthest from the respective bus bar) have a reduced width. The narrow tip portions 1214 are also located at the sections of each IDT electrode that overlap with the edge region E of the other IDT electrode. The widths of the plurality of electrode fingers of each IDT electrode are therefore smaller in both the edge region E of that IDT electrode and the edge region E of the other IDT electrode, as best seen in the view of FIG. 12A.

A duty factor (DF) of the pair of IDT electrodes 1208 in the edge regions E is less than a duty factor of the pair of interdigital transducer electrodes in the central region C, best seen in the comparison of FIGS. 12D and 12E. As can be seen from FIG. 12E, the trench portions 1210 that are cut out of the layer of piezoelectric material 1206 extend a greater distance in the direction of propagation of the acoustic wave to be generated by the IDT 1208, due to the larger separation between the electrode fingers in the edge regions E. As in the previous embodiments, the trench portions 1210 do not extend underneath the sections of the plurality of electrode fingers in the edge region E (in this case the narrow tip portions 1214).

The DF of the IDT 1208 in the edge regions E may be about 0.4, and the DF of the IDT 1208 in the central region C may be about 0.5. As discussed earlier, a duty factor of 0.5 in the central region C is beneficial, as reducing the DF below 0.5 in the central region leads to a decrease in the static capacitance and therefore an increase in the size of the device.

Figures 13A, 13B, 13C:
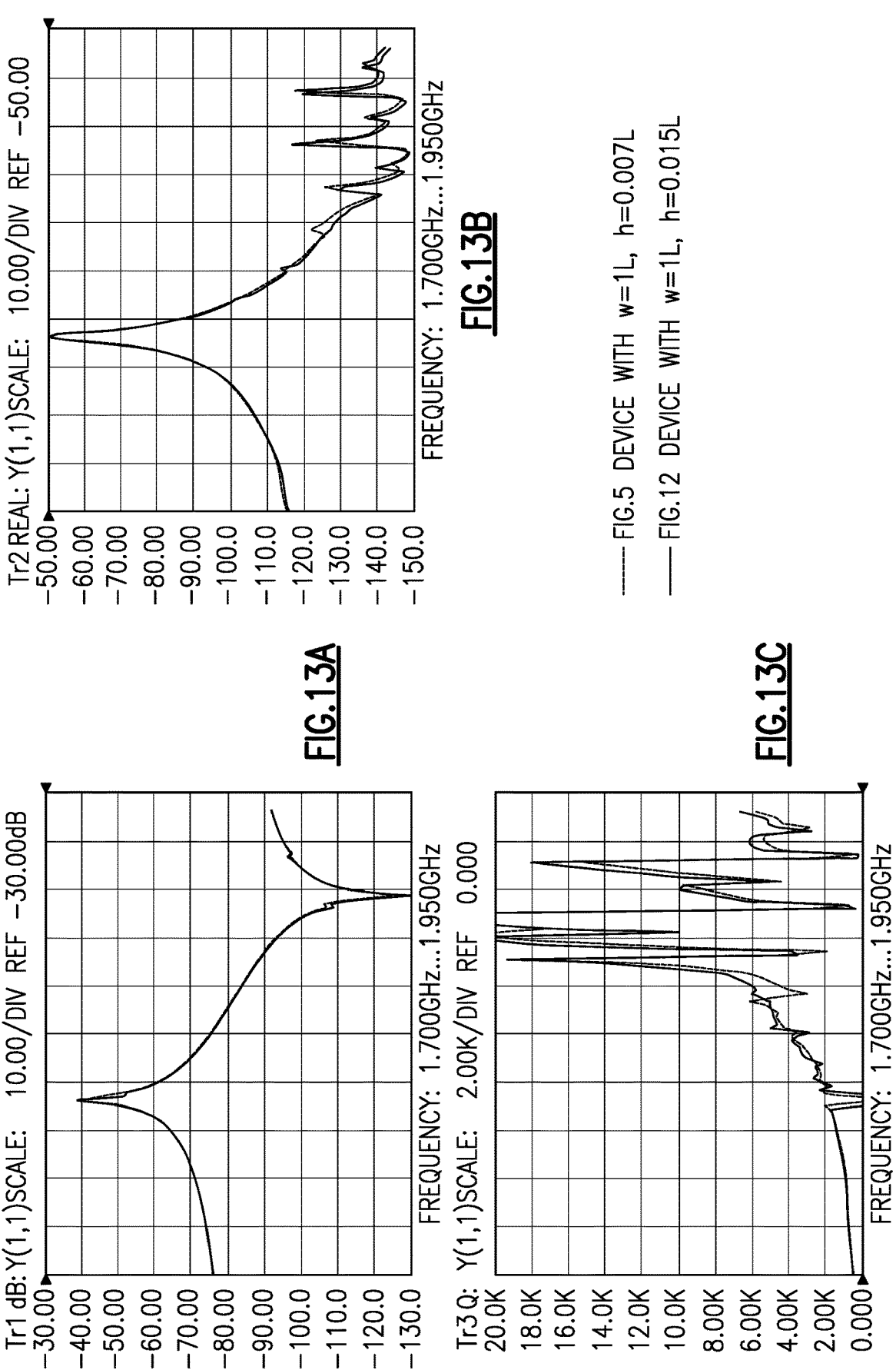
FIG. 13A is a graph showing a comparison of admittance curves of acoustic wave devices according to aspects disclosed herein.
FIG. 13B is a graph showing a comparison of admittance curves of acoustic wave devices according to aspects disclosed herein.
FIG. 13C is a graph showing a comparison of quality factor curves of acoustic wave devices according to aspects disclosed herein.

FIGS. 13A to 13C are simulation graphs showing a comparison between admittance curves (complex FIG. 13A, and real FIG. 13B) and quality factor curves (Q-factor, FIG. 13C) of the acoustic wave device 1200 of FIGS. 12A to 12E, compared to the acoustic wave device 500 of FIGS. 5A to 5E.

The dashed line trace in FIGS. 13A to 13C shows the simulation for the acoustic wave device 500 of FIGS. 5A to 5E, including the mini bus bars 512, and with trench portions 510 having width w=1λ and depth h=0.007λ, where λ is the wavelength of the main acoustic wave to be generated by the IDT 508. The solid line trace in FIGS. 13A to 13C shows the simulation for the acoustic wave device 1200 of FIGS. 12A to 12E, without any mini bus bars, but instead with the narrow tip portions 1214 with DF=0.4 in the edge regions E and DF=0.5 in the central region C, and with trench portions 1210 having width w=1λ and depth h=0.015λ, where λ is the wavelength of the main acoustic wave to be generated by the IDT 1208.

As can be seen from FIGS. 13A to 13C, the suppression of the transverse modes is very comparable between the acoustic wave device 1200 with narrow tip portions 1214, and the acoustic wave device 500 of FIGS. 5A to 5E, despite the lack of mini bus bars in the acoustic wave device 1200 of FIGS. 12A to 12E. The acoustic wave device 1200 including the narrow tip portions 1214 therefore provides an improvement over the acoustic wave device 1000 of FIGS. 10A to 10C.

The acoustic wave device 1200 of FIGS. 12A to 12E performs comparably to the acoustic wave device 500 of FIGS. 5A to 5E when the depth h of the trench portions 1210 is larger than that of the trench portions 510. Here a depth of h=0.015λ combined with the narrow tip portions 1214 is comparable to a depth of h=0.007λ without the narrow tip portions.

Although described above without mini bus bars, the acoustic wave device 1200 of FIGS. 12A to 12E including the narrow tip portions 1214 could also include mini bus bars in some embodiments, similar to the mini bus bars 512 described in FIGS. 5A to 5E.

Figure 14A:
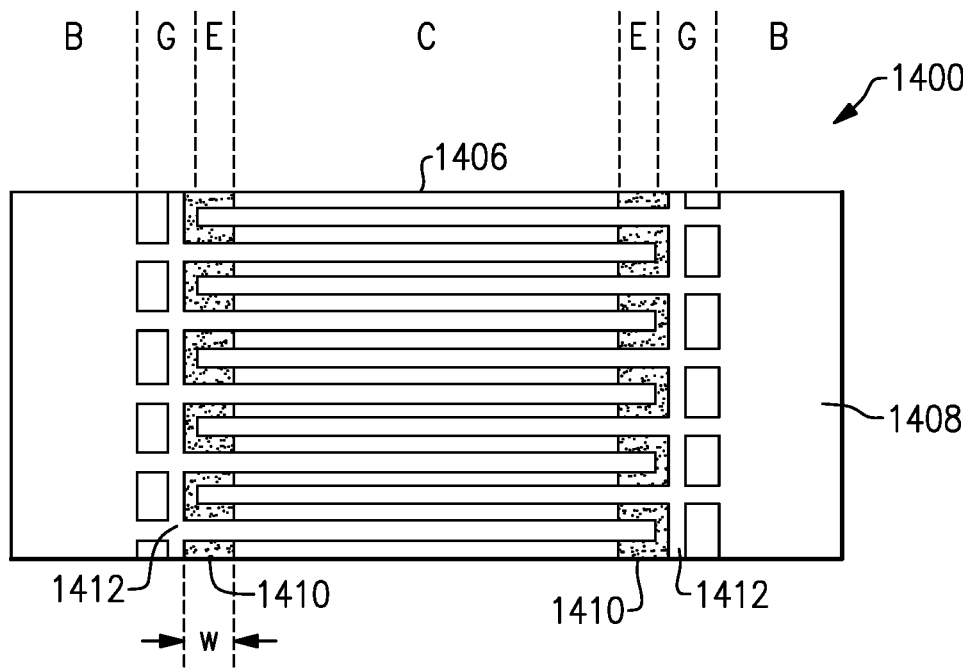
FIG. 14A is a plan view of an acoustic wave device according to aspects disclosed herein.

FIG. 14A shows a plan view of another embodiment. The acoustic wave device 1400 of FIG. 14A is identical to the acoustic wave device 500 of FIGS. 5A to 5E, except that the widths of the trench portions 1410 have been extended into the gap regions G. As well as overlapping with the edge regions E of the IDT 1408, the trench portions 1410 in the upper surface of the layer of piezoelectric material 1406 also overlap with at least part of the gap regions G. The other identical components of the acoustic wave device 1400 have been given analogous reference numerals.

In general, the trench portion 1410 could be stretched into the gap regions G, away from the active region of the IDT 1408, by any distance. In the embodiment of FIG. 14A, the acoustic wave device 1400 includes mini bus bars 1412 (second bus bars), and the trench portions extend into the gap regions G all the way up to the edge of the mini bus bars 1412. The trench portions 1410 each have a width w in a direction perpendicular to the direction of propagation of an acoustic wave to be generated by the IDT 1408 that extends from the respective edge region E to the second bus bar 1412 of the other IDT electrode.

Figure 14B:
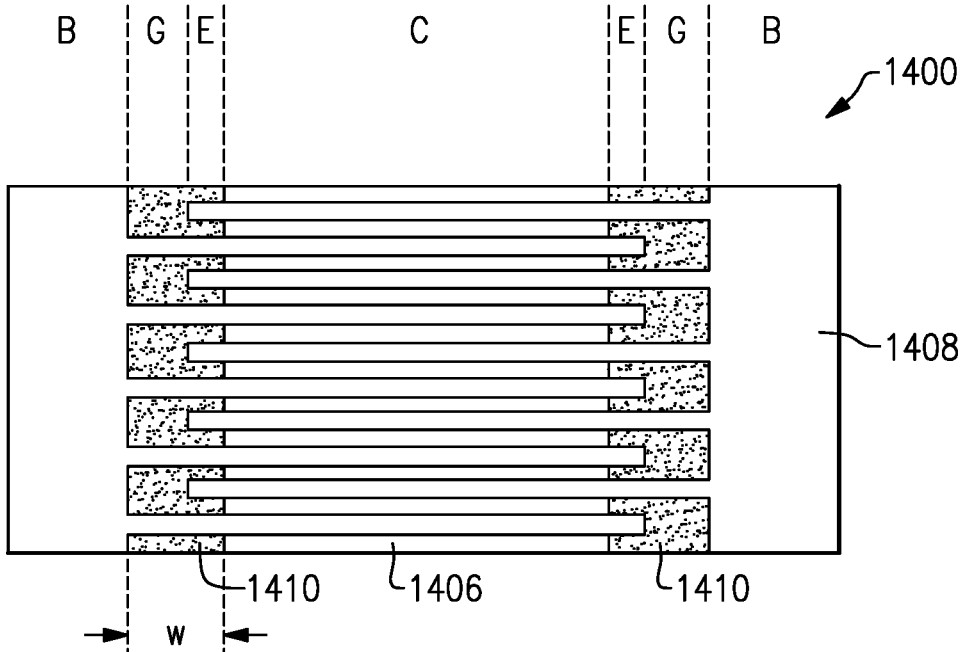
FIG. 14B is a plan view of an acoustic wave device according to aspects disclosed herein.

An alternate embodiment is shown in FIG. 14B, where no mini bus bars are present. The acoustic wave device 1400 of FIG. 14B is identical to the acoustic wave device 1000 of FIGS. 10A to 10C, except that the widths of the trench portions 1410 have been extended into the gap regions G. Again, the trench portion 1410 could be stretched into the gap regions G, away from the active region of the IDT 1408, by any distance. In the embodiment shown in FIG. 14B, the trench portions 1410 extend into the gap regions G all the way up to the edge of the main bus bars of the IDT 1408. The trench portions 1410 each have a width w in a direction perpendicular to the direction of propagation of an acoustic wave to be generated by the IDT 1408 that extends from the respective edge region E to the bus bar (bus bar region B) of the other electrode. As the trench portions 1410 are not cut into the areas of the layer of piezoelectric material 1406 that are covered by the IDT 1408, the width w of the trench portions 1410 cannot extend beyond the gap region G into the bus bar region B.

In either of the embodiments of FIG. 14A or 14B, the properties of the acoustic wave device are largely unchanged by the width of the trench portions 1410 extending into the gap region G. However, such a configuration is easier to manufacture, as in general wider trench portions 1410 are easier to fabricate than narrower trench portions.

Figures 15A, 15B, 15C:
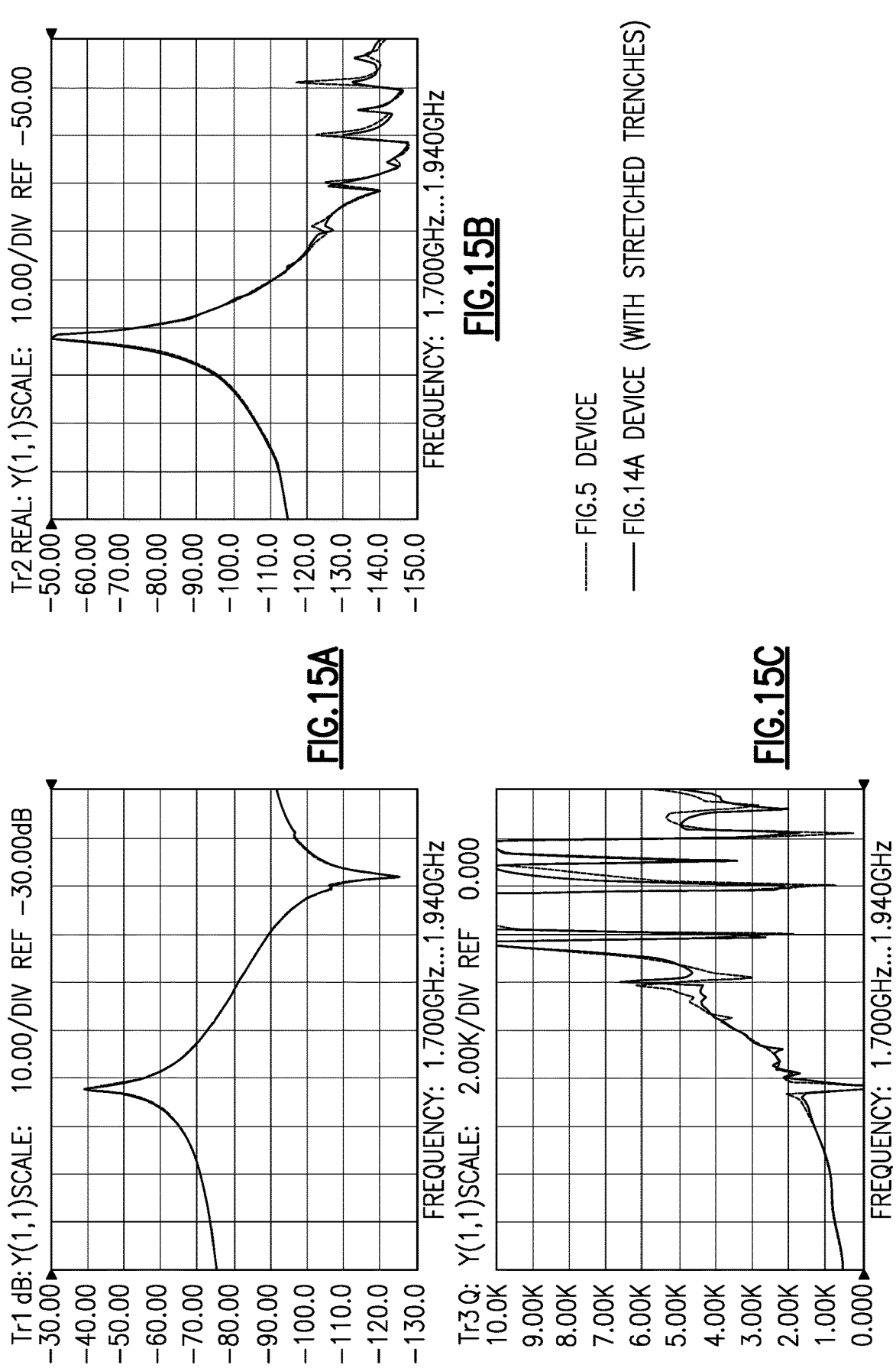
FIG. 15A is a graph showing a comparison of admittance curves of acoustic wave devices according to aspects disclosed herein.
FIG. 15B is a graph showing a comparison of admittance curves of acoustic wave devices according to aspects disclosed herein.
FIG. 15C is a graph showing a comparison of quality factor curves of acoustic wave devices according to aspects disclosed herein.

FIGS. 15A to 15C are simulation graphs showing a comparison between admittance curves (complex FIG. 15A, and real FIG. 15B) and quality factor curves (Q-factor, FIG. 15C) of the acoustic wave device 1400 of FIG. 14A, compared to the acoustic wave device 500 of FIGS. 5A to 5E.

The solid line trace in FIGS. 15A to 15C shows the simulation for the acoustic wave device 1400 of FIGS. 14A, with trench portions 1410 having a depth h=0.007λ, where λ is the wavelength of the main acoustic wave to be generated by the IDT 1408, and a width w extended through the entire edge regions E into the gap regions G up to the mini bus bars 1412. The dashed line trace in FIGS. 15A to 15C shows the simulation for the acoustic wave device 500 of FIGS. 5A to 5E, including the mini bus bars 512, and with trench portions 510 having width w=1λ and depth h=0.007λ, where λ is the wavelength of the main acoustic wave to be generated by the IDT 508.

As can be seen from FIGS. 15A to 15C, the suppression of the transverse modes is very comparable between the acoustic wave device 1400 of FIG. 14A and the acoustic wave device 500 of FIGS. 5A to 5E. Therefore, it is acceptable to increase the width of the trench portions 1410 into the gap regions G without degrading performance of the device, thus enabling simpler manufacture of the device.

In some embodiments, the acoustic wave devices 1400 of FIGS. 14A and 14B could also including the narrow tip portions 1214 described in relation to FIGS. 12A to 12E. The narrow tip portions 1214 of FIGS. 12A to 12E may be combined with the stretched trench portions 1410.

A method of manufacturing an acoustic wave device as disclosed herein will now be described with reference to FIGS. 16A to 16E. The method will be described in relation to the acoustic wave device 500 of FIGS. 5A to 5E. However, the method could be appropriately adapted to manufacture the other embodiments described herein, as would be understood by the skilled person.

Figure 16A:
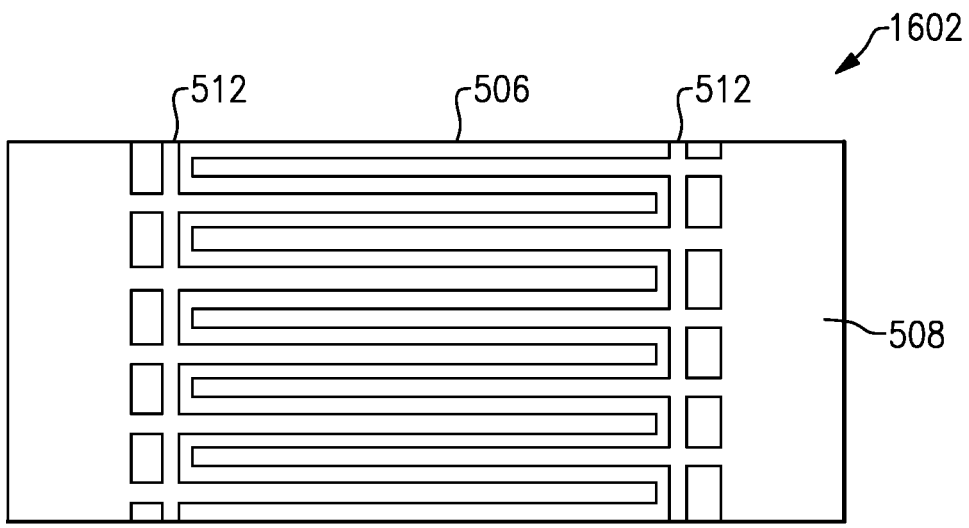
FIG. 16A shows a step of manufacturing an acoustic wave device according to aspects disclosed herein.

In a first step 1602 shown in FIG. 16A a layer of piezoelectric material 506 is provided, with a pair of IDT electrodes 508 disposed on an upper surface of the layer of piezoelectric material 506. In some embodiments, the layer of piezoelectric material 506 may be part of a MPS including a layer of dielectric material and a carrier substrate. In step 1602 an acoustic wave device the same as the acoustic wave device 500 of FIGS. 5A to 5E is provided, except that no trench portions are yet present in the layer of piezoelectric material 506. Various fabrication methods as known in the art could be used to form the layer of piezoelectric material and IDT of the initial acoustic wave device of step 1602 without the trench portions.

In a second step, trench portions 510 are etched into desired locations in the upper surface of the layer of piezoelectric material 506 not covered by the IDT 508. The trench portions 510 overlap with the edge regions E of the interdigital transducer electrodes, as described in FIGS. 5A to 5E. In some embodiments, the trench portions may also overlap with at least part of the gap regions G, as described in FIGS. 14A and 14B.

Figure 16B:
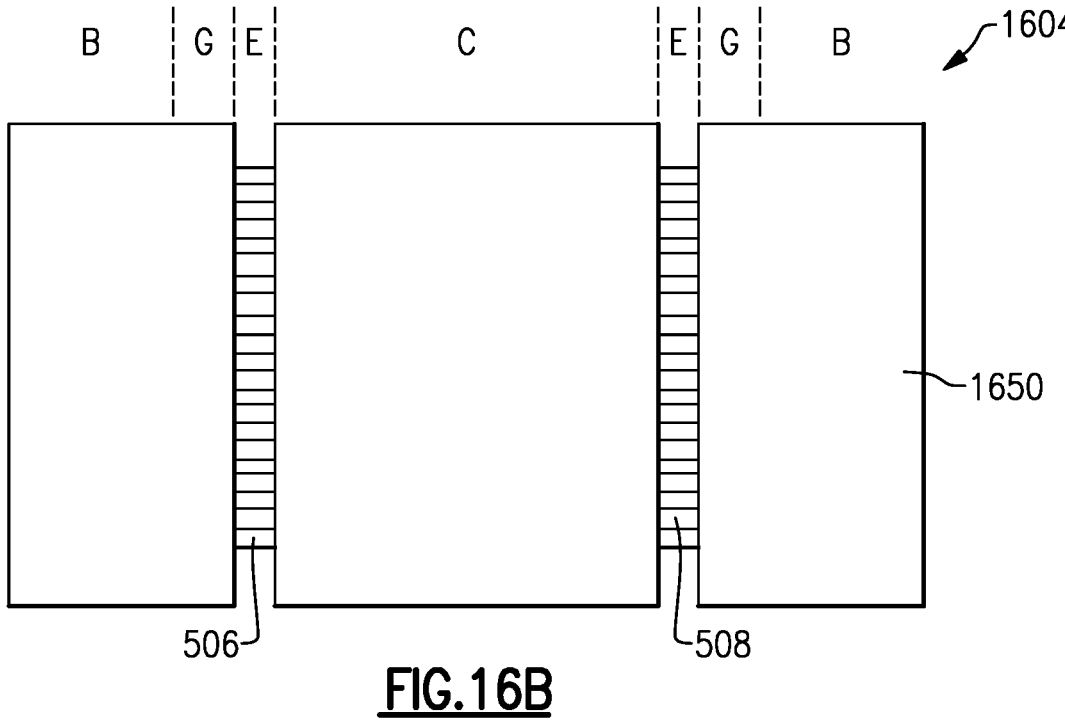
FIG. 16B shows a step of manufacturing an acoustic wave device according to aspects disclosed herein.

In more detail, in some embodiments the etching involves the step 1604 shown in FIG. 16B of positioning an etching mask 1650 over the upper surface of the acoustic wave device. The etching mask is resistant to etching, so that it protects the areas of the upper surface of the layer of piezoelectric material 506 that it covers preventing those areas from being affected by the etching process. The areas of the upper surface of the layer of piezoelectric material 506 that are not covered by the etching mask 1650 or the IDT 508 remain exposed to the etching process. The etching mask 1650 covers all areas of the layer of piezoelectric material 506 except those where the trench portions 510 are to be located.

Figure 16C:
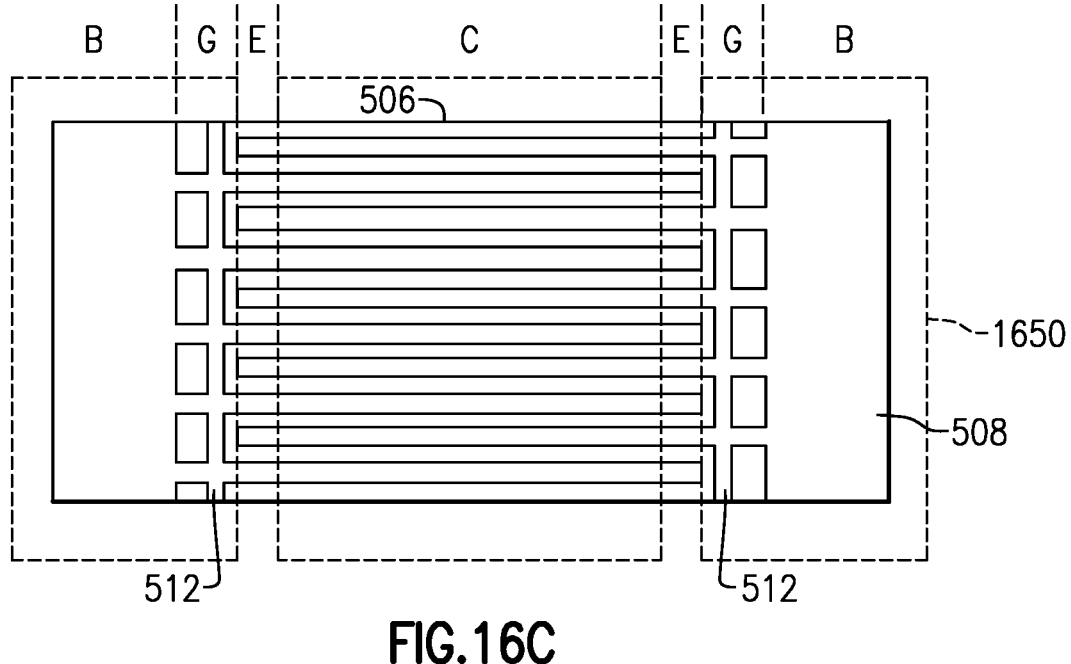
FIG. 16C shows a step of manufacturing an acoustic wave device according to aspects disclosed herein.

The dashed outline in FIG. 16C shows the position of the etching mask 1650 in step 1604 in more detail. As can be seen in FIG. 16C, the etching mask 1650 covers all of the upper surface of the layer of piezoelectric material 506 except for in the edge regions E. Therefore, the trench portions 510 will only be formed in the edge regions E during etching, resulting in an acoustic wave device 500 as shown in FIGS. 5A to 5E. In other embodiments, a different shape of etching mask 1650 may be used to form the trench portions of alternative embodiments. For example, to form the trench portions 1410 in the embodiments of FIGS. 14A and 14B, an etching mask 1650 that leaves some or all of the gap regions G uncovered may be used. The step of positioning the etch resistant mask 1650 includes covering the pair of IDT electrodes and the upper surface of the layer of piezoelectric material other than in the edge regions E and, in some embodiments, at least part of the gap regions G.

Figures 16D, 16E:
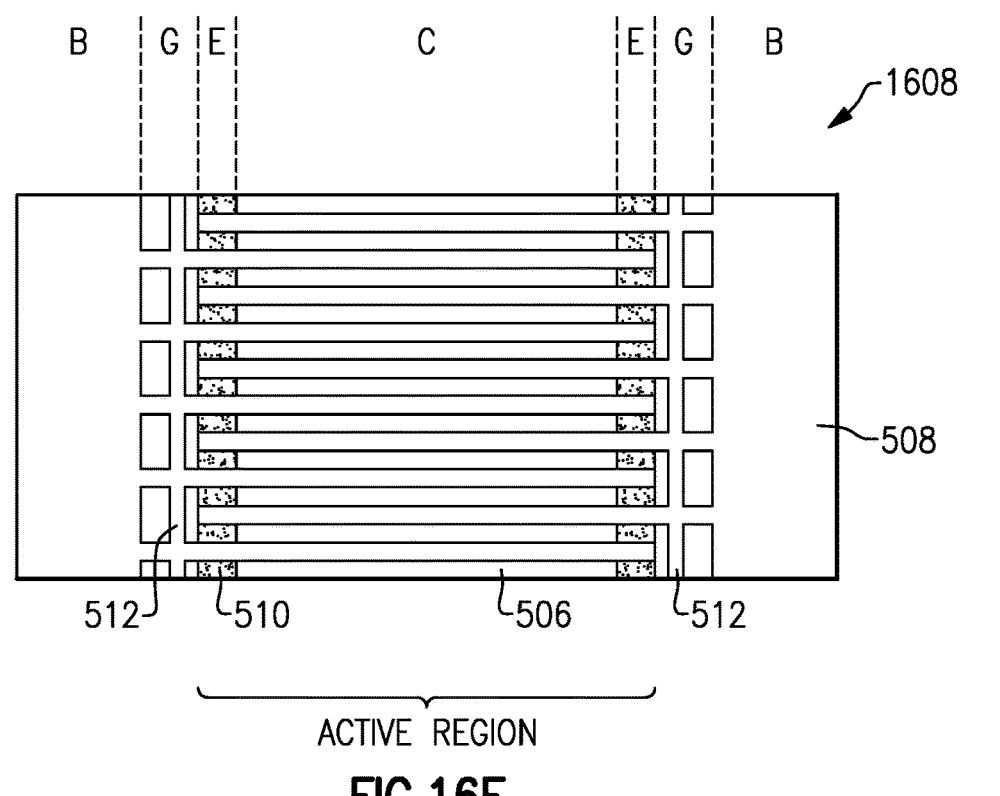
FIG. 16D shows a step of manufacturing an acoustic wave device according to aspects disclosed herein.
FIG. 16E shows a step of manufacturing an acoustic wave device according to aspects disclosed herein.
Figures 17A, 17B, 17C:
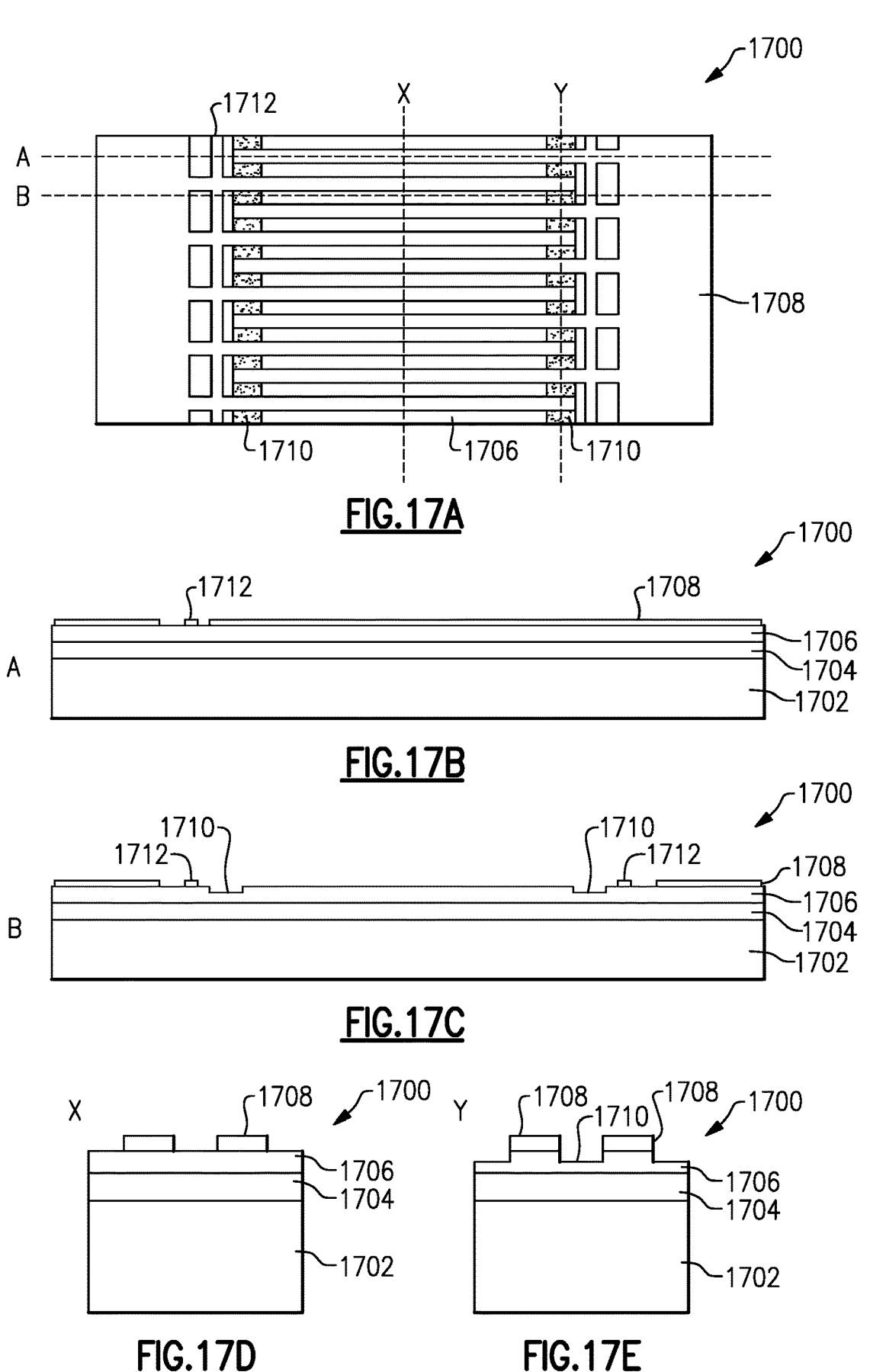
FIG. 17A is a plan view of an acoustic wave device according to aspects disclosed herein.
FIG. 17B is a cross-sectional view of the acoustic wave device of FIG. 17A.
FIG. 17C is a cross-sectional view of the acoustic wave device of FIG. 17A.
Figures 18A, 18B, 18C:
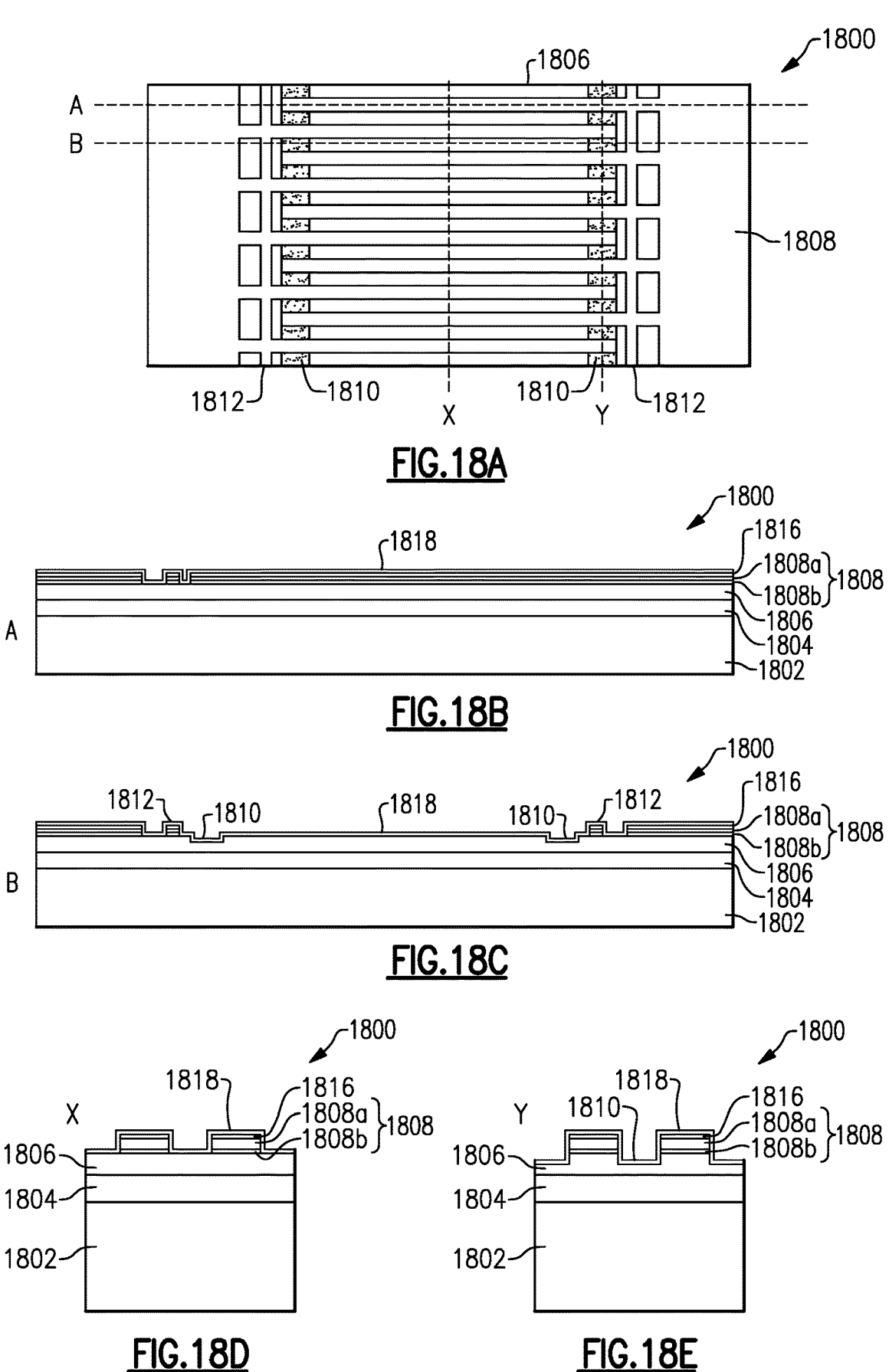
FIG. 18A is a plan view of an acoustic wave device according to aspects disclosed herein.
FIG. 18B is a cross-sectional view of the acoustic wave device of FIG. 18A.
FIG. 18C is a cross-sectional view of the acoustic wave device of FIG. 18A.

Once the etching mask is positioned correctly, etching occurs in step 1606, as shown in FIG. 16D. The etching step 1606 forms the trench portions 510 in the upper surface of the layer of piezoelectric material 506 not covered by the etching mask 1605 or the IDT 508. Various types of etching processes may be used, for example, any of chemical etching, laser etching, dry etching, vapor phase etching, wet etching, or plasma etching. The etching process can be controlled to set the depth h of the trench portions 510 cut into the layer of piezoelectric material 506. The etching mask 1650 controls the width w of the trench portions 510 cut into the layer of piezoelectric material 506.

In step 1608, shown in FIG. 16E, the etching mask 1650 is removed, leading to the finished acoustic wave device 500 including the trench portions 510.

Figures 3A, 3B:
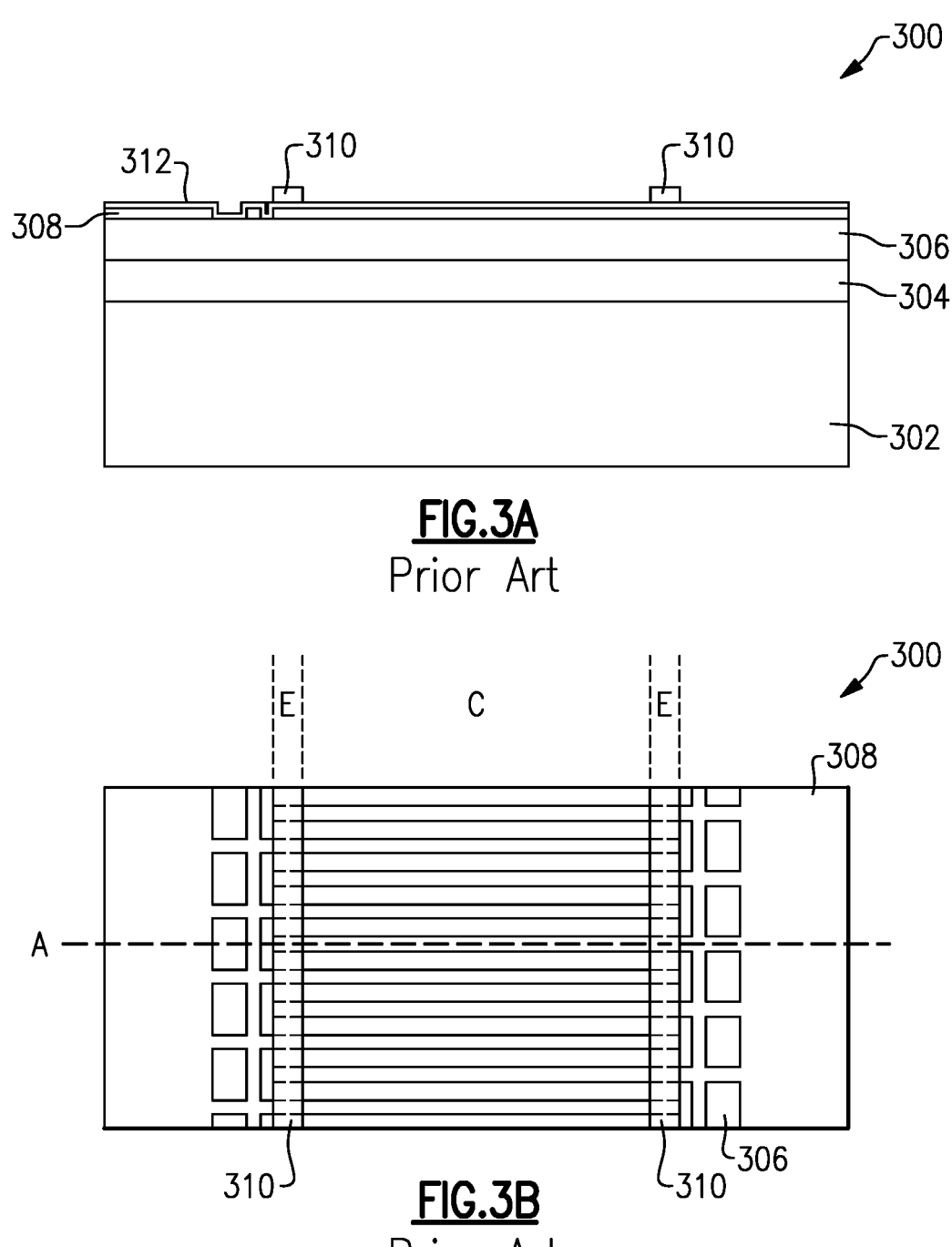
FIG. 3A is a cross-sectional side view of an acoustic wave device of the prior art.
FIG. 3B is a plan view of the acoustic wave device of FIG. 3A.

The above described etching process reduces the risk of damage to the central region C of the IDT compared to, for example, fabrication of the mass loading strips of FIGS. 3A and 3B. The IDT 508 including the central region is formed before the etching process occurs, and from a fabrication point of view, the central region C of the IDT 508 is not damaged by the etching.

As seen in FIG. 16C, the areas of the acoustic wave device not covered by the etching mask 1605 during etching also includes sections of the IDT 508. The sections of the IDT 508 that are exposed during etching need to be carefully considered to ensure that the etching process does not damage the exposed parts of the IDT 508. The specific materials of the IDT 508 are chosen to protect the exposed sections of the IDT 508 during etching.

For example, in each of the previous described embodiments, a multilayer IDT is used, with an upper IDT layer 508a,1008a,1208a and a lower IDT layer 508b,1008b, 1208b. In embodiments with such IDT configurations, a high density IDT material that is etch resistant is chosen as the upper IDT layer 508b,1008b,1208b. The high density upper IDT layer protects the exposed sections of the IDT during the etching process, even when not covered by the etching mask 1650. The high density upper IDT layer also protects the surface of the piezoelectric material underneath the IDT and therefore the surface of the piezoelectric material underneath the IDT is not removed during the etching process.

The high density IDT material of the upper IDT layer may be any of copper Cu, platinum Pt, tungsten W, molybdenum Mo, ruthenium Ru, iridium Ir, gold Au, or silver Ag. Preferably, copper is chosen as the high density material for the upper IDT layer 508b,1008b,1208b, as it is resistant to etching chemicals as well as being highly conductive, meaning resistive loss is reduced.

The lower IDT layer 508a,1008a,1208a can include materials that are not etch resistant, such as aluminum Al, due to the high density upper IDT layer. However, other materials that are etch resistant may still be used as the lower layer in some embodiments, for example a copper Cu lower layer. In some embodiments, the IDT may include multiple lower IDT layers underneath the upper IDT layer.

In a specific embodiment, a high density molybdenum Mo layer may be used as the upper IDT layer 508b,1008b, 1208b, and lower density but higher conductivity aluminum Al may be used as the lower layer 508a,1008a,1208a.

In general, the IDT may be formed through one or more of mask printing, deposition such as physical vapor deposition, electroplating, a lift-off process, a dry etching process, or the like. A lift-off process is preferred.

In an alternative embodiment, instead of a multilayer IDT as single layer IDT may be used. FIGS. 17A to 17E show an acoustic wave device 1700 in an embodiment with a single layer IDT 1708. The acoustic wave device 1700 includes a carrier substrate 1702, a layer of dielectric material 1704, a layer of piezoelectric material 1706, a single layer IDT 1708 with mini bus bars 1712, and trench portions 1710 located in the upper surface of the layer of piezoelectric material. The acoustic wave device 1700 of FIGS. 17A to 17E is identical to the acoustic wave device 500 of FIGS. 5A to 5E, except that a single layer IDT 1708 is used. The single layer IDT could be used in combination with any of the embodiments described previously.

In the acoustic wave device 1700 with a single layer IDT 1708, a high density, etch resistant material is used in the IDT 1708, such as those identified above: copper Cu, platinum Pt, tungsten W, molybdenum Mo, ruthenium Ru, iridium Ir, gold Au, or silver Ag. Copper is again preferable, for the reasons mentioned above.

Either the single layer IDT 1708 or the multilayer IDT 508,1008,1208 may be combined with one or more thin adhesion layers (not shown), such as a layer of titanium Ti, nickel Ni, or chromium Cr. Such thin adhesion layers may be located between any of the boundaries between the IDT layers and piezoelectric layer, which is beneficial for the fabrication process.

FIGS. 18A to 18E show another embodiment. The acoustic wave device 1800 uses a hard mask layer 1816 to protect the IDT during fabrication, particularly during the etching process. The acoustic wave device 1800 includes a carrier substrate 1802, a layer of dielectric material 1804, a layer of piezoelectric material 1806, an IDT 1808 with an upper layer 1808a and a lower layer 1808b and mini bus bars 1812, and trench portions 1810 located in the upper surface of the layer of piezoelectric material. The acoustic wave device 1800 is identical to the acoustic wave device 500 of FIGS. 5A to 5E, but further includes the mask layer 1816.

The mask layer 1816 is applied onto the upper surfaces the IDT 1808 before etching to protect the IDT during the etching process. The mask layer 1816 is a thin layer that is not susceptible to etching, and therefore prevents any damage or etching of the IDT 1808. The mask layer 1816 may therefore also be referred to as an etch stop layer. The mask layer 1816 is more difficult to etch than the materials of the IDT 1808. The mask layer 1816 therefore allows any materials to be used in the IDT, without damage occurring to the IDT 1808 during formation of the trench portions 1810. A material not resistant to etching, for example, aluminum, could be used as the upper surface of the IDT when combined with the protective mask layer 1816, without any damage occurring to the IDT.

The IDT when covered by the mask layer 1816 may include any of the following materials: aluminum Al, copper Cu, titanium Ti, platinum Pt, tungsten W, molybdenum Mo, ruthenium Ru, iridium Ir, gold Au, silver Ag, or nickel Ni. The mask layer 1816 may be applied to any of the IDT structures described above, such as a multilayer IDT as shown in FIGS. 18A to 18E, or a single layer IDT, such as the IDT 1708 shown in FIGS. 17A to 17E.

The mask layer 1816 may be combined with any of the embodiments described previously. The mask layer 1816 may be left on after the trench portions are formed, with the mask layer therefore being present in the fully fabricated acoustic wave device. This prevents the possibly of damage to the IDT by trying to remove the mask layer 1816.

Preferably, the mask layer 1816 is a thin layer of chromium Cr. In a specific embodiment, a chromium layer of between 5 nm and 50 nm is used. Chromium is preferred because it is etch resistant and has a high etch selectivity, meaning it is etched at a slower rate than other materials. (Etch selectivity is the ratio of etch rates between materials.) In a specific embodiment, a chromium hard mask layer 1816 could be used in combination with a multilayer IDT with a molybdenum lower layer 1808b, and an etch susceptible aluminum upper layer 1808a.

The acoustic wave device 1800 of FIGS. 18A to 18E also includes an optional protective layer 1818 disposed over the entire upper surface of the acoustic wave device. The protective layer 1818 covers the upper surfaces of the IDT 1808 (in this embodiment, the mask layer 1816), and the upper surfaces of the layer of piezoelectric material 1806 not covered by the IDT (including within the trench portions 1810). The protective layer 1818 is a thin coating covering the whole of the top surface of the acoustic wave device 1800. The protective layer is disposed onto the upper surface of the acoustic wave device after the etching step is complete, and the etching mask 1650 has been removed, and is left on the device permanently.

The protective layer 1818 acts as a passivation layer and also protects the IDT from any external chemical damage. In some embodiments, the protective layer 1818 may be formed from one or more of silicon nitride (SiN), silicon oxynitride (SiON), or silicon dioxide (SiO$_2$). a multilayer combination of these materials may also be used as the protective layer 1818.

The protective layer 1818 may be included in any of the embodiments described previously, including acoustic wave devices without the mask layer 1816.

Figures 19A, 19B, 19C, 19D, 19E:
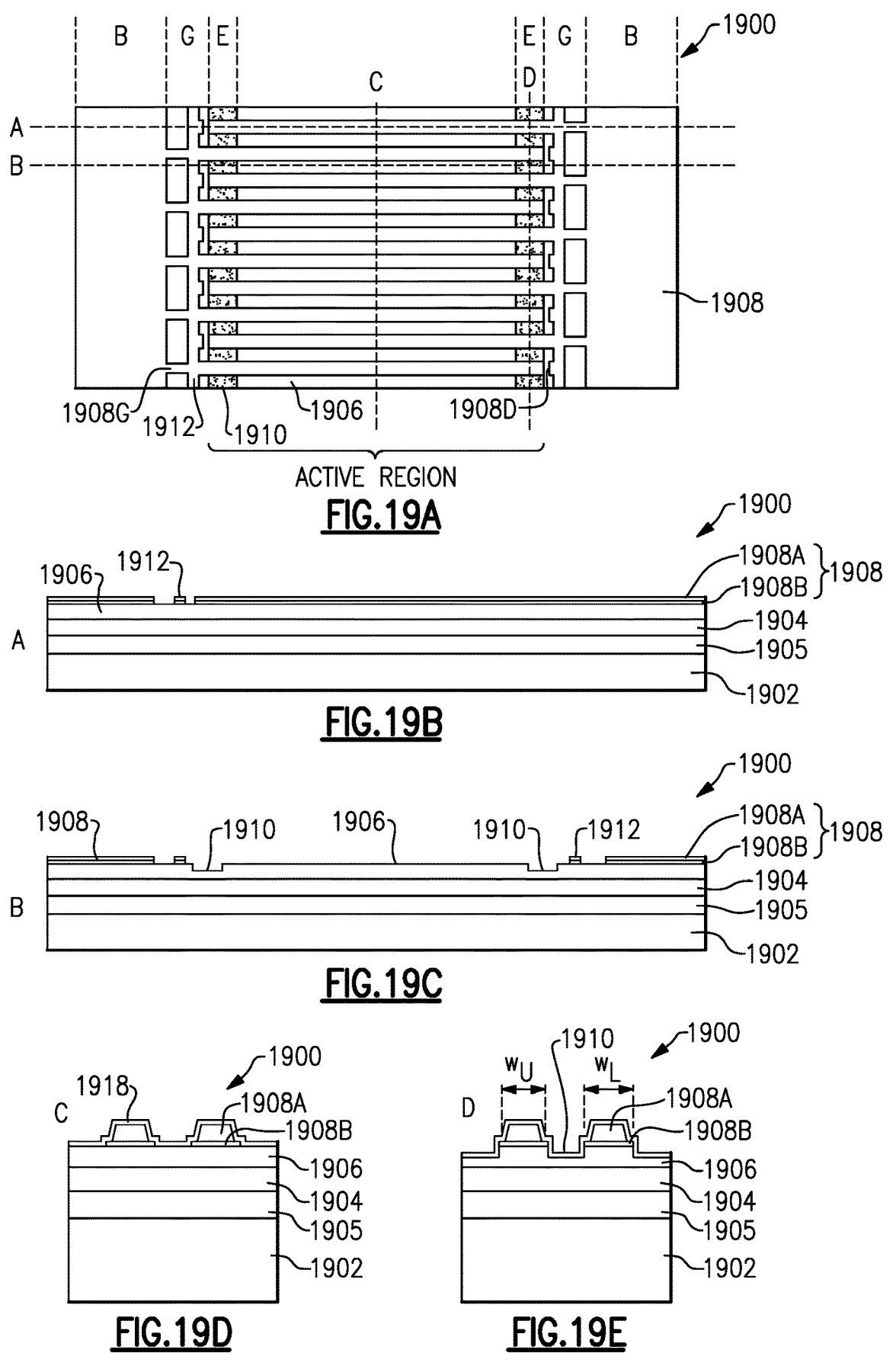

FIGS. 19A-19E show another embodiment. FIG. 19A is a plan view of the SAW device 1900. FIGS. 19B and 19C show cross-sections through the lines in FIG. 19A labeled A and B respectively. FIGS. 19D and 19E show partial cross-sections through the lines in FIG. 19A labeled D and E, respectively (with only two IDT fingers shown in FIGS. 19D and 19E for clarity).

The embodiment of FIGS. 19A-19E is similar to that of FIGS. 5A-5E, but includes additional features that may be used individually or in combination in any of the embodiments disclosed herein. The acoustic wave device 1900 includes a carrier substrate 1902, a layer of dielectric material 1904, a layer of piezoelectric material 1906, an IDT 1980 with an upper layer 1908a and a lower layer 1908b, and trench portions 1910 located in the upper surface of the layer of piezoelectric material. The acoustic wave device 1900 is similar to the acoustic wave device 500 of FIGS. 5A-5E with some notable differences. The MPS of the acoustic wave device 1900 includes not only the carrier substrate 1902, the layer of dielectric material 1904, and the layer of piezoelectric material 1906, but also an additional layer 1905 disposed between the carrier substrate 1902 and the layer of dielectric material 1904. The additional layer 1905 may include or consist of, for example, aluminum nitride, silicon nitride, poly-silicon, or amorphous silicon. The additional layer 1905 may be a trap-rich layer that helps improve the quality factor Q of the acoustic wave device by reducing the effects of parasitic surface conductivity on the upper surface of the carrier substrate 1902.

Another difference between the acoustic wave device 1900 and acoustic wave device 500 is that acoustic wave device 1900 includes short dummy electrode fingers 1908D extending from sides of the mini-busbars 1912 facing the central region C through a portion of the gap region G toward tips of IDT electrode fingers extending from the opposite busbars. The short dummy electrode fingers 1908D may have the same width and may be aligned with the IDT electrode fingers toward which they extend. The short dummy electrode fingers 1908D may increase the quality factor Q of the acoustic wave device 1900 by providing better confinement of the acoustic wave in the resonator while keeping transverse modes suppressed.

The acoustic wave device 1900 also includes portions of the IDT electrode fingers 1908G within the gap region G between the mini-busbars 1912 and main busbars that are thinner than the remainder of the IDT electrode fingers in a direction of propagation of the main acoustic wave through the device. These thinner portions 1908G of the IDT electrode fingers may also increase the quality factor Q of the acoustic wave device 1900 by providing better confinement of the acoustic wave in the resonator.

The IDT electrode fingers of the acoustic wave device 1900 may be similar to those of previously described embodiments in that they include a lower layer 1908B of a high density material such as Mo or W and an upper layer 1908A having a higher conductivity but lower density than the lower layer 1908B. The upper layer 1908A may include or consist of Al, for example. In contrast to the previously described embodiments, the width $w_L$ of the lower layer 1908B of the IDT electrode fingers may be greater than the width $w_U$ of a base of the upper layer 1908A in the direction of propagation of the main acoustic wave through the device. Further, the upper layer 1908A of the IDT electrodes may include tapered sides and a flat upper surface such that it is trapezoidal in cross-section. A protective layer or passivation film 1918 formed from one or more of Silicon nitride, silicon oxide (or silicon dioxide), or silicon oxynitride may cover the IDT electrode fingers and otherwise exposed portions of the upper surface of the piezoelectric layer 1906. The tapered shape of the upper layer 1908A of the IDT electrode fingers may be beneficial to more easily provide for conformal coverage by the protective layer 1918. The tapered shape and reduced base width of the upper layer 1908A of the IDT electrode fingers also gives less mass loading than a square shaped electrode. Static capacitance of the IDT electrode fingers is determined by the width of the lower layer 1908B. Too much mass loading may result in a reduction in quality factor Q of the device. By using IDT electrodes with tapered upper layers 1908A, a high Q may be maintained along with sufficient static capacitance.

Each of the above described embodiments suppress the transverse modes through a piston mode distribution, that is implemented without a decrease in the duty factor of the of the central region C of the IDT, preventing an unwanted increase in size of the device. Moreover, the formation of the trench portions through etching results in an easier fabrication, that is less likely to damage the central region C of the IDT. Lastly, the combination of the trench portions with the MPS results in a device with a high Q-factor, high electromechanical coupling coefficient (K2), excellent temperature coefficient of frequency (TCF), and high power durability.

The embodiments of the acoustic wave device disclosed herein may be used in various different implementations. The acoustic wave device may be used in any device that includes an IDT. For example, the acoustic wave device may be used in various types of acoustic wave resonators and/or filters, including 1-port resonators, 2-port resonators, ladder filters, and the like. In a resonator configuration, one or more reflector electrodes may be included surrounding/sandwiching the IDT. Although the embodiments above have been described with only one IDT, other configurations are possible, as would be understood by the skilled person.

It should be appreciated that the various embodiments of acoustic wave devices illustrated in the figures, as well as the other circuit elements illustrated in other figures presented herein, are illustrated in a highly simplified form. The relative dimensions of the different features are not shown to scale. Further, typical acoustic wave devices would commonly include a far greater number of electrode fingers in the IDTs than illustrated.

The concepts and embodiments of acoustic wave devices described herein are applicable to various types of devices, as would be understood by the skilled person. For example, the invention may be applied to filters, duplexers, diplexers or the like. The suppression of transverse modes in the above described acoustic wave devices may lead to an overall improvement in the overall functioning of the circuit.

Figure 20:
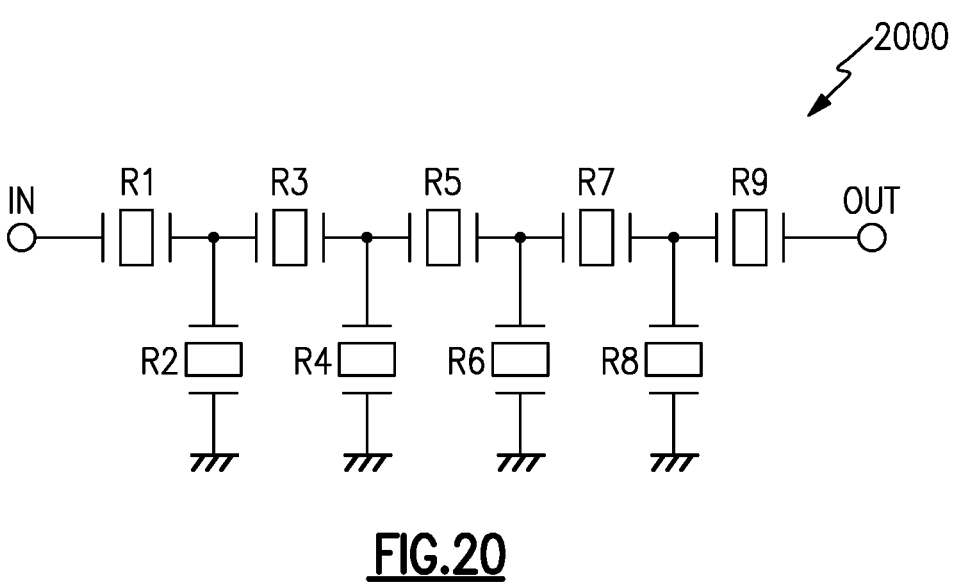
FIG. 20 shows an example of a ladder filter in which multiple acoustic wave devices according to aspects disclosed herein may be combined.

For example, FIG. 20 shows an example of a SAW filter 2000 which multiple acoustic wave devices as disclosed herein may be combined. FIG. 20 shows an RF ladder filter 2000 including a plurality of series resonators R1, R3, R5, R7, and R9, and a plurality of parallel (or shunt) resonators R2, R4, R6, and R8. As shown, the plurality of series resonators R1, R3, R5, R7, and R9 are connected in series between the input and the output of the RF ladder filter, and the plurality of parallel resonators R2, R4, R6, and R8 are respectively connected between nodes between adjacent series resonators and ground in a shunt configuration. Other filter structures and other circuit structures known in the art that may include SAW devices or resonators, for example, duplexers, baluns, etc., may also be formed including examples of acoustic wave devices as disclosed herein.

Figure 21:
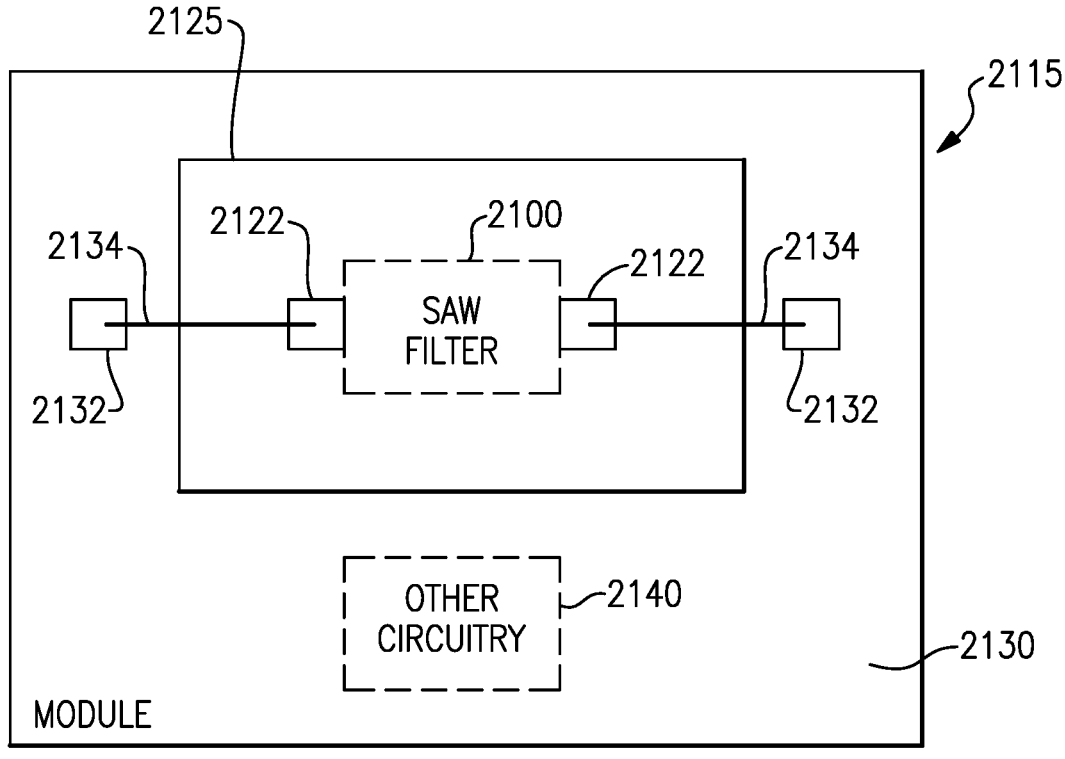
FIG. 21 is a block diagram of one example of a filter module that can include one or more acoustic wave devices according to aspects disclosed herein.
Figure 22:
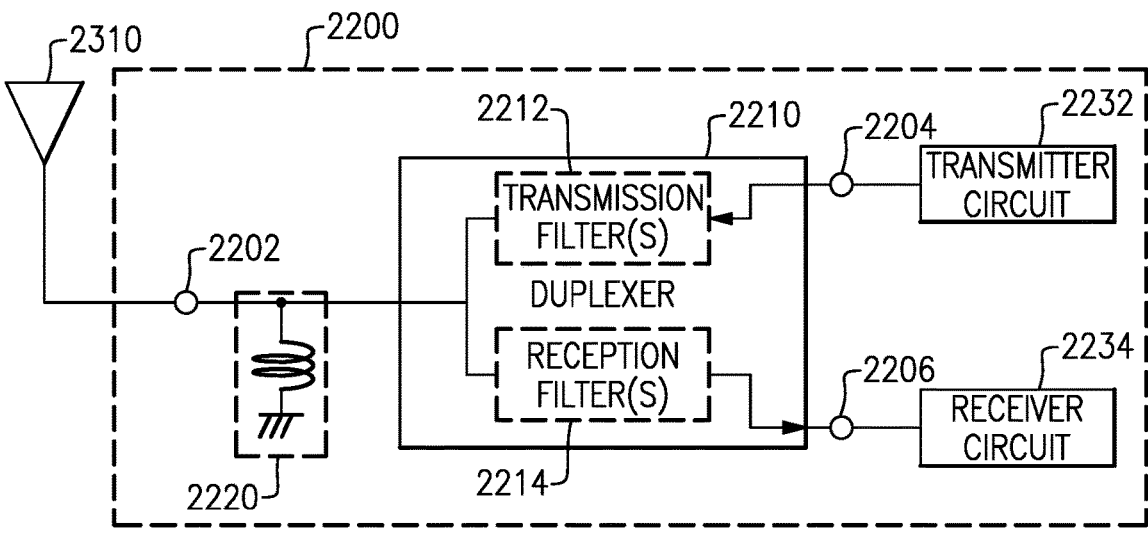
FIG. 22 is a block diagram of one example of a front-end module that can include one or more filter modules including acoustic wave devices according to aspects of the present disclosure.
Figure 23:
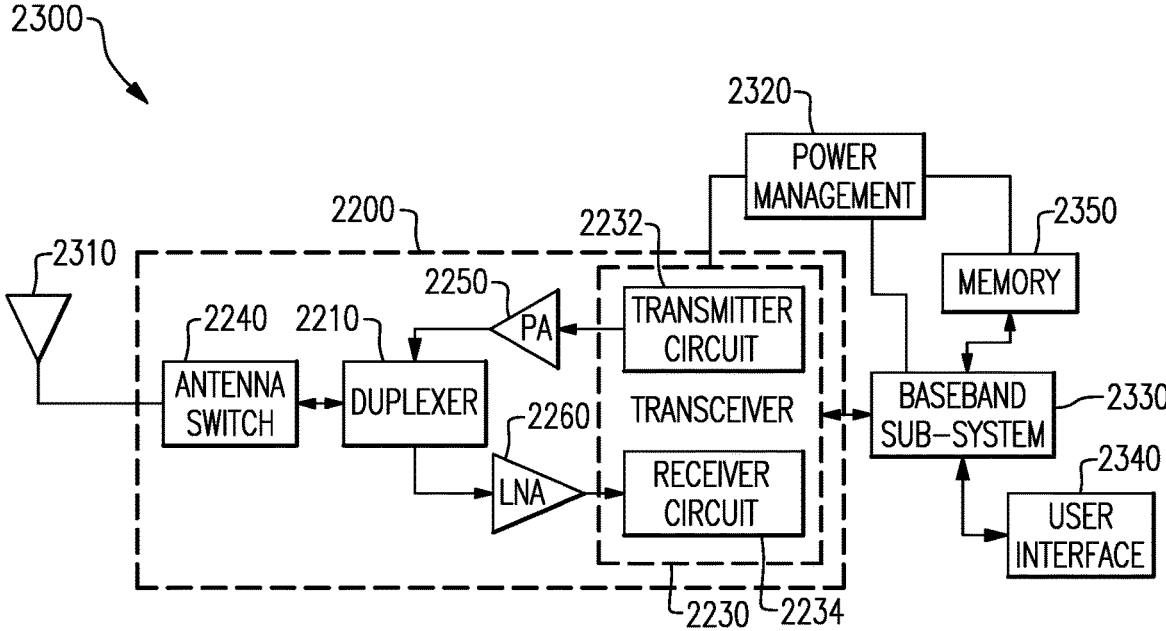
FIG. 23 is a block diagram of one example of a wireless device including the front-end module of FIG. 22.

Moreover, embodiments of acoustic wave devices discussed herein can be implemented in a variety of packaged modules. Some examples of packaged modules will now be discussed in which any suitable principles and advantages of the acoustic wave devices discussed herein can be implemented. FIGS. 21, 22, and 23 are schematic block diagrams of illustrative packaged modules and devices according to certain embodiments.

As discussed above, acoustic wave devices, such as those of FIGS. 5, 10, 12, 14, 17 and 18, can be used in radio frequency (RF) filters. In turn, an RF filter such as the SAW filter of FIG. 19, may be incorporated into and packaged as a module that may ultimately be used in an electronic device, such as a wireless communications device, for example. FIG. 21 is a block diagram illustrating one example of a module 2115 including a SAW filter 2100. The SAW filter 2100 may be implemented on one or more die(s) 2125 including one or more connection pads 2122. For example, the SAW filter 2100 may include a connection pad 2122 that corresponds to an input contact for the SAW filter and another connection pad 2122 that corresponds to an output contact for the SAW filter. The packaged module 2115 includes a packaging substrate 2130 that is configured to receive a plurality of components, including the die 2125. A plurality of connection pads 2132 can be disposed on the packaging substrate 2130, and the various connection pads 2122 of the SAW filter die 2125 can be connected to the connection pads 2132 on the packaging substrate 2130 via electrical connectors 2134, which can be solder bumps or wirebonds, for example, to allow for passing of various signals to and from the SAW filter 2100. The module 2115 may optionally further include other circuitry die 2140, for example, one or more additional filter(s), amplifiers, prefilters, modulators, demodulators, down converters, and the like, as would be known to one of skill in the art of semiconductor fabrication in view of the disclosure herein. In some embodiments, the module 2115 can also include one or more packaging structures to, for example, provide protection and facilitate easier handling of the module 2115. Such a packaging structure can include an overmold formed over the packaging substrate 2130 and dimensioned to substantially encapsulate the various circuits and components thereon.

Various examples and embodiments of the SAW filter 2100 can be used in a wide variety of electronic devices. For example, the SAW filter 2100 can be used in an antenna duplexer, which itself can be incorporated into a variety of electronic devices, such as RF front-end modules and communication devices.

Referring to FIG. 22, there is illustrated a block diagram of one example of a front-end module 2200, which may be used in an electronic device such as a wireless communications device (e.g., a mobile phone) for example. The front-end module 2200 includes an antenna duplexer 2210 having a common node 2202, an input node 2204, and an output node 2206. An antenna 2310 is connected to the common node 2202.

The antenna duplexer 2210 may include one or more transmission filters 2212 connected between the input node 2204 and the common node 2202, and one or more reception filters 2214 connected between the common node 2202 and the output node 2206. The passband(s) of the transmission filter(s) are different from the passband(s) of the reception filters. Examples of the SAW filter 2100 can be used to form the transmission filter(s) 2212 and/or the reception filter(s) 2214. An inductor or other matching component 2220 may be connected at the common node.

The front-end module 2200 further includes a transmitter circuit 2232 connected to the input node 2204 of the duplexer 2210 and a receiver circuit 2234 connected to the output node 2206 of the duplexer 2210. The transmitter circuit 2232 can generate signals for transmission via the antenna 2310, and the receiver circuit 2234 can receive and process signals received via the antenna 2310. In some embodiments, the receiver and transmitter circuits are implemented as separate components, as shown in FIG. 22, however, in other embodiments these components may be integrated into a common transceiver circuit or module. As will be appreciated by those skilled in the art, the front-end module 2200 may include other components that are not illustrated in FIG. 22 including, but not limited to, switches, electromagnetic couplers, amplifiers, processors, and the like.

FIG. 23 is a block diagram of one example of a wireless device 2300 including the antenna duplexer 2210 shown in FIG. 22. The wireless device 2300 can be a cellular phone, smart phone, tablet, modem, communication network or any other portable or non-portable device configured for voice or data communication. The wireless device 2300 can receive and transmit signals from the antenna 2310. The wireless device includes an embodiment of a front-end module 2200 similar to that discussed above with reference to FIG. 22. The front-end module 2200 includes the duplexer 2210, as discussed above. In the example shown in FIG. 23 the front-end module 2200 further includes an antenna switch 2240, which can be configured to switch between different frequency bands or modes, such as transmit and receive modes, for example. In the example illustrated in FIG. 23, the antenna switch 2240 is positioned between the duplexer 2210 and the antenna 2310; however, in other examples the duplexer 2210 can be positioned between the antenna switch 2240 and the antenna 2310. In other examples the antenna switch 2240 and the duplexer 2210 can be integrated into a single component.

The front-end module 2200 includes a transceiver 2230 that is configured to generate signals for transmission or to process received signals. The transceiver 2230 can include the transmitter circuit 2232, which can be connected to the input node 2204 of the duplexer 2210, and the receiver circuit 2234, which can be connected to the output node 2206 of the duplexer 2210, as shown in the example of FIG. 22.

Signals generated for transmission by the transmitter circuit 2232 are received by a power amplifier (PA) module 2250, which amplifies the generated signals from the transceiver 2230. The power amplifier module 2250 can include one or more power amplifiers. The power amplifier module 2250 can be used to amplify a wide variety of RF or other frequency-band transmission signals. For example, the power amplifier module 2250 can receive an enable signal that can be used to pulse the output of the power amplifier to aid in transmitting a wireless local area network (WLAN) signal or any other suitable pulsed signal. The power amplifier module 2250 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 2250 and associated components including switches and the like can be fabricated on gallium arsenide (GaAs) substrates using, for example, high-electron mobility transistors (pHEMT) or insulated-gate bipolar transistors (BiFET), or on a silicon substrate using complementary metal-oxide semiconductor (CMOS) field effect transistors.

Still referring to FIG. 23, the front-end module 2200 may further include a low noise amplifier (LNA) module 2260, which amplifies received signals from the antenna 2310 and provides the amplified signals to the receiver circuit 2234 of the transceiver 2230.

The wireless device 2300 of FIG. 23 further includes a power management sub-system 2320 that is connected to the transceiver 2230 and manages the power for the operation of the wireless device 2300. The power management system 2320 can also control the operation of a baseband sub-system 2330 and various other components of the wireless device 2300. The power management system 2320 can include, or can be connected to, a battery (not shown) that supplies power for the various components of the wireless device 2300. The power management system 2320 can further include one or more processors or controllers that can control the transmission of signals, for example. In one embodiment, the baseband sub-system 2330 is connected to a user interface 2340 to facilitate various input and output of voice and/or data provided to and received from the user. The baseband sub-system 2330 can also be connected to memory 2350 that is configured to store data and/or instructions to facilitate the operation of the wireless device, and/or to provide storage of information for the user.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 5 GHz, such as in a range from about 500 MHz to 3 GHz.

Further examples of the electronic devices that aspects of this disclosure may be implemented include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of this disclosure. Accordingly, the foregoing description and drawings are by way of example only, and the scope of the disclosure should be determined from proper construction of the appended claims, and their equivalents.

What is claimed is:

1. A method of manufacturing an acoustic wave device, the method comprising:

providing a layer of piezoelectric material;

disposing a pair of interdigital transducer electrodes on an upper surface of the layer of piezoelectric material, each interdigital transducer electrode including a bus bar and a plurality of electrode fingers extending from the bus bar towards an edge region of the interdigital transducer electrode at distal ends of the electrode fingers; and etching trench portions into the upper surface of the layer of piezoelectric material, the trench portions extending into the layer of piezoelectric material but not through the layer of piezoelectric material, the trench portions overlapping with the edge regions of the interdigital transducer electrodes.

2. The method of manufacturing of claim 1 further comprising, before the etching, positioning an etch resistant mask to cover the pair of interdigital transducer electrodes and the upper surface of the layer of piezoelectric material other than in the edge regions.

3. The method of manufacturing of claim 1 wherein the etching includes etching the trench portions in areas of the upper surface of the layer of piezoelectric material that are overlapped by the edge regions of the interdigital transducer electrodes and that are not covered by the interdigital transducer electrodes.

4. The method of manufacturing of claim 1 wherein the disposing the pair of interdigital transducer electrodes on the upper surface of the layer of piezoelectric material includes forming each interdigital transducer electrode from a single layer of etch resistant material.

5. The method of manufacturing of claim 4 wherein the etch resistant material is selected from the group consisting of copper, platinum, tungsten, molybdenum, ruthenium, iridium, gold, and silver.

6. The method of manufacturing of claim 1 wherein disposing the pair of interdigital transducer electrodes on the upper surface of the layer of piezoelectric material includes forming each interdigital transducer electrode from one or more lower layers of material and an upper layer of etch resistant material selected from the group consisting of copper, platinum, tungsten, molybdenum, ruthenium, iridium, gold, and silver.

7. The method of manufacturing of claim 6 wherein disposing the pair of interdigital transducer electrodes on the upper surface of the layer of piezoelectric material includes forming upper layers of the plurality of electrode fingers with a lesser maximum width than the one or more lower layers of the plurality of electrode fingers.

8. The method of manufacturing of claim 6 wherein disposing the pair of interdigital transducer electrodes on the upper surface of the layer of piezoelectric material includes forming upper layers of the plurality of electrode fingers with trapezoidal cross-sections.

9. The method of manufacturing of claim 1 further comprising, before the etching, applying a mask layer onto the upper surfaces of each of the pair of interdigital transducer electrodes.

10. The method of manufacturing of claim 9 wherein the mask layer is a layer of chromium.

11. The method of manufacturing of claim 1 further comprising, after the etching, disposing a protective layer over the upper surfaces of the pair of interdigital transducer electrodes and the layer of piezoelectric material.

12. The method of manufacturing of claim 11 wherein the protective layer is formed from one or more of the group consisting of silicon nitride, silicon oxynitride, and silicon dioxide.

13. The method of manufacturing of claim 1 wherein the electrode fingers of each interdigital transducer electrode disposed on the upper surface of the layer of piezoelectric material interleave with one another in an active region of the pair of interdigital transducer electrodes, and form gap regions between the ends of the fingers of one of the interdigital transducer electrodes and the bus bar of the other interdigital transducer electrode.

14. The method of manufacturing of claim 13 wherein the trench portions etched into the upper surface of the layer of piezoelectric material also overlap with at least part of the gap regions.

15. The method of manufacturing of claim 14 further comprising, before the etching, positioning an etch resistant mask to cover the pair of interdigital transducer electrodes and the upper surface of the layer of piezoelectric material other than in the edge regions and the at least part of the gap regions.

16. The method of manufacturing of claim 13 wherein disposing the pair of interdigital transducer electrodes on the upper surface of the layer of piezoelectric material includes disposing a second bus bar within the gap region.

17. The method of manufacturing of claim 16 wherein disposing the pair of interdigital transducer electrodes on the upper surface of the layer of piezoelectric material includes forming dummy electrodes extending from the second bus bar partially through the gap region toward an adjacent edge region.

18. The method of manufacturing of claim 13 wherein the active region includes a central region and the edge regions of the interdigital transducer electrodes, each edge region extending from tips of the plurality of electrode fingers of one of the interdigital transducer electrodes towards a center of the central region.

19. The method of manufacturing of claim 18 wherein each of the plurality of electrode fingers of the interdigital transducer electrodes disposed on the upper surface of the layer of piezoelectric material has a width in a direction perpendicular to an extension of the electrode fingers that is smaller in the edge regions than in the central regions.

20. The method of manufacturing of claim 1 wherein the etching includes etching using at least one of chemical etching, laser etching, dry etching, vapor phase etching, wet etching, and/or plasma etching.

* * * * *